United States Patent
Domikaitis et al.

(10) Patent No.: US 12,339,325 B1
(45) Date of Patent: Jun. 24, 2025

(54) SYSTEMS AND METHODS FOR A BATTERY ODOMETER WITH ACTIVE SHOCK AND VIBRATION MONITORING

(71) Applicant: Kyma Batteries LLC, Dallas, TX (US)

(72) Inventors: Daniel Domikaitis, La Crescenta, CA (US); Travis Cournoyer, Hawthorne, CA (US)

( * ) Notice: Subject to any disclaimer, the term of this patent is extended or adjusted under 35 U.S.C. 154(b) by 0 days.

(21) Appl. No.: 18/949,747

(22) Filed: Nov. 15, 2024

Related U.S. Application Data

(63) Continuation of application No. 18/797,111, filed on Aug. 7, 2024.

(51) Int. Cl.

| | |
|---|---|
| *G01R 31/3842* | (2019.01) |
| *G01R 31/371* | (2019.01) |
| *G01R 31/392* | (2019.01) |
| *H01M 10/42* | (2006.01) |
| *H01M 10/48* | (2006.01) |

(52) U.S. Cl.
CPC ....... *G01R 31/3842* (2019.01); *G01R 31/371* (2019.01); *G01R 31/392* (2019.01); *H01M 10/425* (2013.01); *H01M 10/4257* (2013.01); *H01M 10/48* (2013.01); *H01M 10/486* (2013.01); *H01M 2010/4278* (2013.01)

(58) Field of Classification Search
None
See application file for complete search history.

(56) References Cited

U.S. PATENT DOCUMENTS

| | | | |
|---|---|---|---|
| 11,705,590 B1* | 7/2023 | Budan | G07C 5/04 |
| | | | 701/106 |
| 2008/0297116 A1* | 12/2008 | Odaohhara | H01M 10/48 |
| | | | 340/815.4 |
| 2017/0003352 A1* | 1/2017 | Barre | G01R 31/007 |
| 2017/0062880 A1* | 3/2017 | Riemer | H02J 7/0047 |
| 2018/0034114 A1* | 2/2018 | Hinterberger | H01M 10/484 |
| 2018/0143262 A1 | 5/2018 | Kondo | |
| 2019/0288344 A1 | 9/2019 | Nakao | |
| 2020/0212699 A1 | 7/2020 | Lee | |

(Continued)

FOREIGN PATENT DOCUMENTS

| | | | |
|---|---|---|---|
| CN | 113972712 A | 1/2022 | |
| CN | 116148697 A | 5/2023 | |

(Continued)

*Primary Examiner* — Jas A Sanghera

(74) *Attorney, Agent, or Firm* — Brozynski & Dalton, PC; Katarzyna Brozynski

(57) ABSTRACT

Systems and methods are disclosed herein for determining the remaining useful life of a battery cell that includes the battery cell's internal resistance and/or shock loading. In one example implementation, the systems and methods disclosed herein monitor acceleration information over time based on information received from an accelerometer integrated in a battery cell and electrical information for at least one electrical parameter of the battery cell over time. The information is stored for determining remaining useful life. In another example implementation, the systems and methods disclosed herein determine a voltage drop across the battery cell and a current output of the battery cell. The systems and methods determine an internal cell resistance of the battery cell based on charge or discharge voltage and current information.

20 Claims, 19 Drawing Sheets

(56) References Cited

U.S. PATENT DOCUMENTS

| | | | |
|---|---|---|---|
| 2021/0152008 A1* | 5/2021 | Yen | .................. H02J 7/007182 |
| 2021/0364575 A1 | 11/2021 | Horiuchi | |
| 2022/0037702 A1* | 2/2022 | Forssell | ............. H02J 7/00719 |
| 2022/0250504 A1 | 8/2022 | Wang | |
| 2024/0051427 A1 | 2/2024 | Sato | |

FOREIGN PATENT DOCUMENTS

| | | |
|---|---|---|
| CN | 118501747 B | 10/2024 |
| JP | 4811610 B2 | 11/2011 |
| KR | 102389992 B1 | 4/2022 |

\* cited by examiner

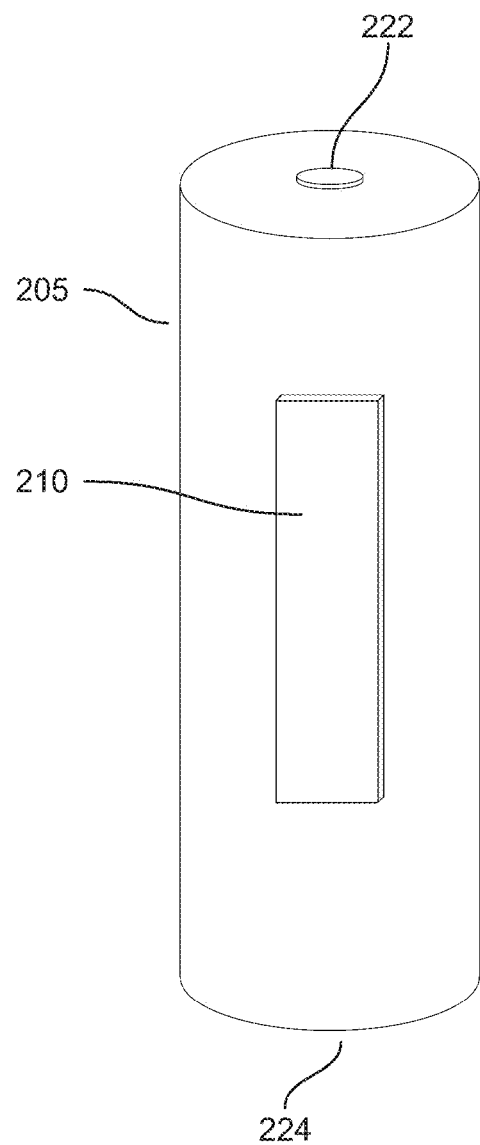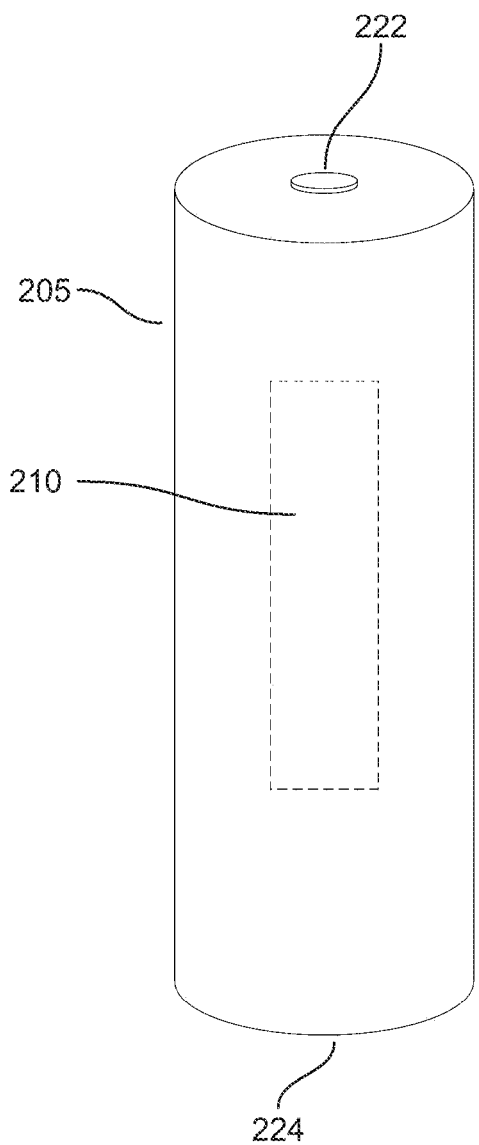
FIG. 2A  FIG. 2B

SYSTEMS AND METHODS FOR A BATTERY ODOMETER WITH ACTIVE SHOCK AND VIBRATION MONITORING

INTRODUCTION

The present disclosure relates to batteries, and in particular to analyzing and monitoring batteries to determine remaining useful life.

SUMMARY

As battery cells age, both with respect to time and usage, the performance of the battery cell degrades. While battery management systems may be used for battery modules or battery packs, which are assembled from individual battery cells, these systems monitor the state of the entire module or pack as opposed to individual cells. With the ever-increasing ubiquitousness of electric vehicles and other electric devices, so too does the demand for batteries that meet certain performance criteria. Additionally, the secondary market for used batteries, and unused units that are deemed too old for use, grows commensurate with the increase in popularity of electric devices and other battery energy systems. However, one drawback to repurposing such battery cells (e.g., removed from a module or pack) with current battery monitoring technology is the inability to quantitatively and qualitatively know or measure the remaining useful life of the individual battery cells.

In accordance with some embodiments of the present disclosure, battery odometer systems and methods are provided for monitoring a battery cell and providing real-time information regarding the remaining useful life of the battery cell that includes, for example, a qualitative and quantitative history. The battery odometer considers information from one or more sensors, including one or more accelerometers, a thermometer, a voltage sensor, or a current sensor. In some embodiments, the battery odometer determines whether the battery cell experiences a shock load that exceeds an acceptable threshold, for example, by continuously or periodically measuring and recording the battery cell's acceleration. If the battery cell experiences a shock load that exceeds a threshold, the battery odometer may provide a real-time indication of such, for example, via a display or other indicator. In other embodiments, the battery odometer periodically determines the battery cell's internal resistance (or impedance), for example, by measuring the cell's open circuit voltage and its voltage drop with a known resistance, to determine the cell's internal resistance. In some embodiments, this is accomplished by discharging a pulse into an internal fuse (or resister) of the battery cell. In other embodiments, the battery odometer determines other performance characteristics, including the voltage output, the current output, temperature, watt-hour throughput, number of charge-discharge cycles, discharge depth, and/or age.

Accordingly, techniques of the present disclosure can be applied to determine the remaining useful life of a battery. In an example implementation, the battery odometer receives information from various sensors to determine the battery's remaining useful life. For example, the battery odometer may receive voltage information from a voltage sensor to determine the voltage output of the battery cell and/or the voltage drop across the battery cell. Additionally, the battery odometer may receive current information from a current sensor to determine the current output and/or input of the battery cell. In some implementations, the battery odometer determines the battery cell's internal resistance based on the voltage information and/or the current information. The internal cell resistance may be stored on a storage device (e.g., a memory). In some implementations, one or more of the components of the battery odometer may be integrated into the battery cell. For example, the voltage sensor, the current sensor, and/or the storage device (e.g., memory) may be integrated in the battery cell.

In another example implementation, the battery odometer receives information from an accelerometer and determines the acceleration that the battery cell experiences. In some implementations, if the battery odometer determines that the battery cell experiences an acceleration that exceeds a threshold, the battery odometer stores such information on a storage device (e.g., a memory) that is integrated into the battery cell. In other implementations, the battery odometer stores and/or sends a notification to an external device, for example, a remote storage device (e.g., a memory) or a notification system. In some implementations, the information used to determine an acceleration maximum and/or whether the acceleration exceeded the threshold is stored and/or sent to a notification system. In some implementations, the acceleration information may be displayed on a local or remote display.

In some implementations, the battery odometer determines the internal resistance of the battery cell by applying a pulse discharge to the battery cell. In such implementations, the battery odometer may apply the pulse discharge to an internal resistor of the battery cell. In some implementations the battery odometer may apply the pulse discharge to an internal fuse of the battery cell. In such implementations the internal fuse may have a known resistance. In some implementations, the pulse discharge originates from a capacitor. In such implementations, the internal resistance of the battery cell is determined by applying a DC or an AC (or simulated AC) pulse charge to the battery cell. In some implementations, the capacitor is integrated into the battery odometer.

In some implementations, the battery odometer may determine the temperature of the battery cell. In such implementations, the battery odometer may receive temperature information from a temperature sensor that is near to or integrated in the battery cell. The temperature sensor may be configured to detect the internal temperature of the battery cell. In other implementations, the temperature sensor may be configured to detect an ambient temperature adjacent the battery cell. In other implementations, the temperature sensor may be configured to determine the internal temperature of one or more energy units of the battery cell. The temperature information may be used by the battery odometer in determining the remaining useful life of the battery cell. The temperature information may be stored in a storage device (e.g., a memory). Alternatively or in addition, the temperature information may be sent to an external device, for example, an external storage device and/or a notification system.

In some implementations, the battery odometer determines the number of charge-discharge cycles of the battery cell. In such implementations, the battery odometer may use voltage information retrieved from one or more voltage sensors and/or current information retrieved from one or more current sensors to determine the number of charge-discharge cycles of the battery cell. In some implementations, the battery odometer may additionally determine a discharge depth of the battery cell, i.e., the amount of energy input into and/or output from the battery cell. In some implementations, the discharge depth of the battery cell is stored at a storage device (e.g., a memory). In other implementations, the discharge depth is sent to an external device, for example, an external storage device (e.g., a remote a memory) and/or a notification system.

In some implementations, the battery odometer determines one or more of the parameters continuously. For example, the battery odometer may continuously monitor the voltage output of the battery cell. In other implementations, the battery odometer determines one or more of the parameters periodically. For example, the battery odometer may determine the voltage output of the battery cell once per every unit of time (e.g., every second, every minute, every day, every week, every month, every year), once per every number of throughput Watt-hours (e.g., every 1000 Watt-hours of output), and/or once per every number of charge-discharge cycles, or any combination thereof.

In some implementations, the battery odometer may optionally include a display. In such implementations, the battery odometer may include any type of display, for example, those that support a graphical user interface. Example displays include liquid crystal displays (LCD), light-emitting diode displays (LED), organic light-emitting diode displays (OLED), quantum dot displays (QLED), or any combination thereof. Alternatively or in addition, the display may include lights or lighted switches to convey one or more of the parameters monitored and/or determined by the battery odometer.

In an example implementation, the systems and methods disclosed herein monitor acceleration information over time based on information received from an accelerometer integrated in a battery cell. The systems and methods monitor electrical information for at least one electrical parameter of the battery cell over time. The systems and methods store the acceleration information and the electrical information for determining remaining useful life of the battery cell. In some implementations, the acceleration information is stored in memory integrated in the battery cell. In some implementations, the systems and methods of the present disclosure additionally determine a maximum acceleration based on the acceleration information and store the maximum acceleration.

In some implementations, at least one electrical parameter includes one or more of a voltage output of the battery cell or a current output of the battery cell.

In some implementations, the systems and methods of the present disclosure additionally determine a number of charge-discharge cycles of the battery cell. In some implementations, such determination is based on the monitored electrical information.

In some implementations, the systems and methods of the present disclosure additionally determine a discharge depth for each charge-discharge cycle of the battery cell based on the electrical information and the number of charge-discharge cycles of the battery cell.

In some implementations, the systems and methods of the present disclosure additionally determine a maximum or minimum value of the acceleration information and the at least one electrical parameter. In some implementations, storing the acceleration information and the electrical information includes storing the maximum or minimum values.

In some implementations, the systems and methods of the present disclosure additionally determine the remaining useful life of the battery cell indicative of the battery cell's projected performance. In some implementations, it is based on the acceleration information and the electrical information.

In another example implementation of the present disclosure, the systems and methods described herein determine a voltage drop across the battery cell based on voltage information received from a voltage sensor integrated in the battery cell. The systems and methods determine a current output of the battery cell based on current information received from a current sensor integrated in the battery cell. The systems and methods determine an internal cell resistance of a battery cell based on the voltage information and the current information. The systems and methods store the internal cell resistance on a memory integrated in the battery cell.

In some implementations, determining the internal resistance of the battery cell includes applying a pulse discharge to the battery cell that includes a voltage similar to a rated use voltage of the battery cell, and the voltage information relates to the pulse discharge applied to the battery cell. In some implementations, determining the internal resistance of the battery cell includes applying a pulse charge to the battery cell that includes a voltage similar to a rated use voltage of the battery cell, and the voltage information relates to the pulse charge applied to the battery cell.

In some implementations, the pulse charge or discharge is discharged into an internal resistor of the battery cell.

In some implementations, determining the internal cell resistance of the battery cell is performed on a periodic basis.

In some implementations, the periodic basis is one or more of: once per a unit of time, once per every predetermined number of throughput watt-hours, or once per every predetermined number of discharge cycles.

In some implementations, the systems and methods of the present disclosure additionally store the voltage information and the current information.

In some implementations, the systems and methods of the present disclosure additionally receive temperature information from a temperature sensor and store the temperature information at the memory.

In some implementations, the systems and methods of the present disclosure additionally determine a number of charge-discharge cycles of the battery cell based on at least one of the voltage information or the current information. In some implementations, the number of charge-discharge cycles of the battery cell is stored at the memory.

In some implementations, the systems and methods of the present disclosure additionally determine a discharge depth of the battery cell for each charge-discharge cycle of the battery cell. In some implementations, the discharge depth of the battery cell is stored at the memory.

In some implementations, the systems and methods of the present disclosure additionally determine an identification of the battery cell and transmit the identification of the battery cell and the internal cell resistance via a near-field communication (NFC) transceiver configured to wirelessly transmit information to an external device.

BRIEF DESCRIPTION OF THE DRAWINGS

The above and other objects and advantages of the disclosure will be apparent upon consideration of the following detailed description, taken in conjunction with the accompanying drawings, in which:

FIGS. 2A-2B depict illustrative perspective views of two example cylindrical-type battery cells, in accordance with various embodiments of the disclosure;

DETAILED DESCRIPTION

Figure 1:
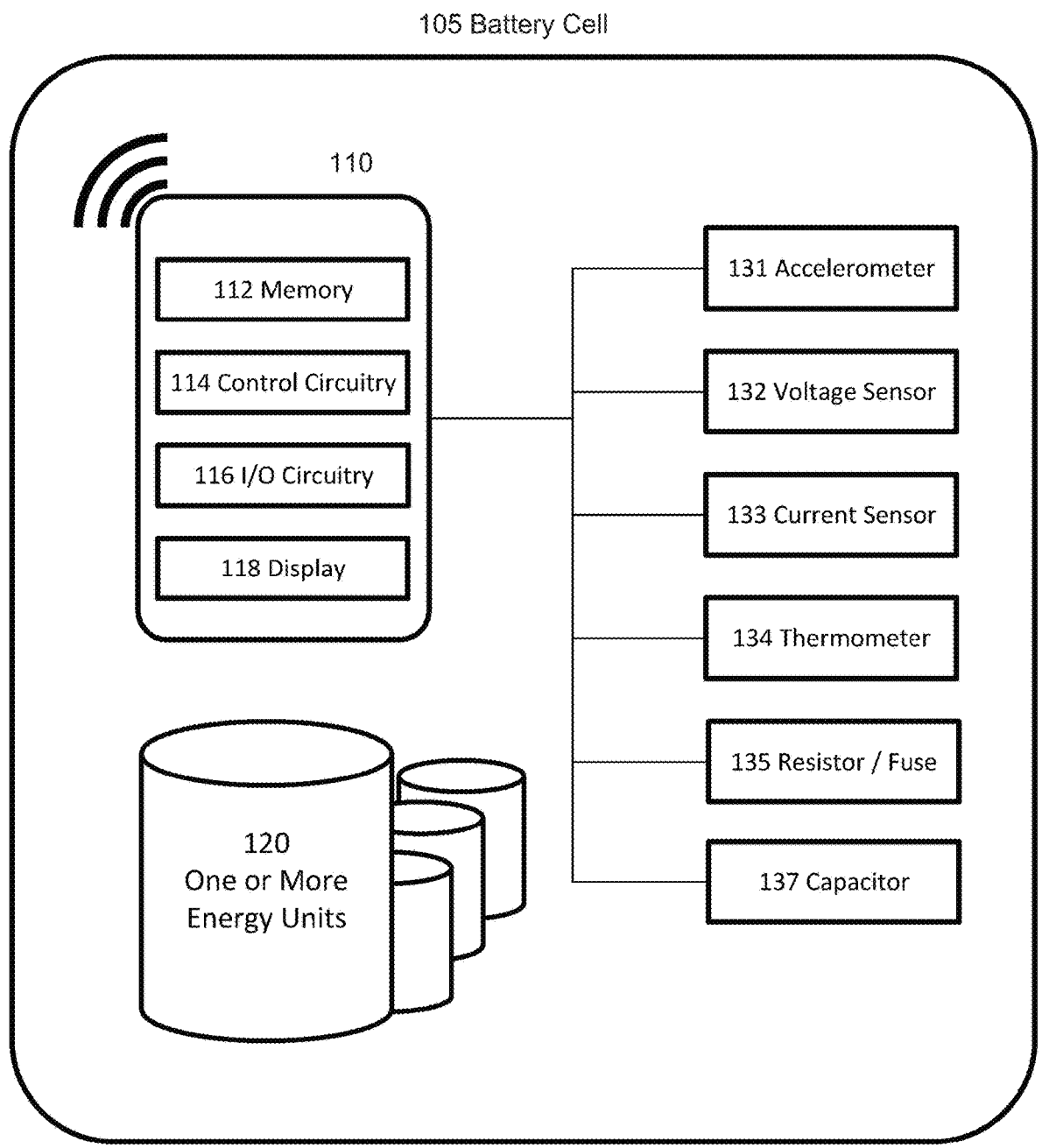
FIG. 1 depicts an illustrative schematic diagram of an example battery cell with an integrated battery odometer, in accordance with various embodiments of the disclosure.

FIG. 1 illustrates an example schematic diagram of an example battery cell 105 with an integrated battery odometer 110, according to various embodiments of the present disclosure. In an embodiment, battery cell 105 includes battery odometer 110 and one or more energy units 120. Battery odometer 110 may include memory 112, control circuitry 114, and input-output (I/O) circuitry 116. Battery cell 105 may further include accelerometer 131, voltage sensor 132, current sensor 133, thermometer 134, and/or resistor/fuse 135. Battery odometer 110 communicates with one or more components, for example, accelerometer 131, voltage sensor 132, current sensor 133, and thermometer 134. In some embodiments, battery odometer 110 communicates with one or more other external components via I/O circuitry 116.

In an embodiment, battery odometer 110 receives acceleration information from accelerometer 131 integrated into battery cell 105. Battery odometer 110 analyzes the acceleration information to determine the shock loading that battery cell 105 experiences. Although a single accelerometer may be illustrated and described, any number of accelerometers may be implemented without departing from the contemplated embodiments. For example, accelerometer 131 may be embodied by single-axis accelerometer (i.e., capable of detecting acceleration in one direction). In another example, accelerometer 131 may be embodied by multiple single-axis accelerometers. In such an example, accelerometer 131 may include three individual single-axis accelerometers, configured to detect acceleration in each of three axes (i.e., up-down (z-axis), left-right (x-axis), back-forward (y-axis)). In other examples, accelerometer 131 may be embodied by a single multi-axis accelerometer, i.e., capable of detecting acceleration in multiple directions. Additionally, accelerometer 131 may include multiple accelerometers configured similarly to add redundancy and/or to increase the robustness of the acceleration detection.

Although a particular type of accelerometer may be illustrated and described, any type of accelerometer may be implemented without departing from the contemplated embodiments. Example types of accelerometers that may be implemented include bulk micromachined capacitive accelerometers, bulk micromachined piezoelectric resistive accelerometers, capacitive spring mass system base accelerometers, DC response accelerometers, electromechanical servo (servo force balance) accelerometers, high gravity accelerometers, high temperature accelerometers, laser accelerometers, low frequency accelerometers, magnetic induction accelerometers, modally tuned impact hammer accelerometers, null-balance accelerometers, optical accelerometers, pendulous integrating gyroscopic accelerometers (PIGA), piezoelectric accelerometers, quantum (rubidium atom cloud, laser cooled), resonance accelerometers, seat pad accelerometers, shear mode accelerometers, strain gauge accelerometers, surface acoustic wave (SAW) accelerometers, surface micromachined capacitive (MEMS) accelerometers, thermal (submicrometric CMOS process) accelerometers, triaxial accelerometers, vacuum diode with flexible anode accelerometers, potentiometric accelerometers, and LVDT type accelerometers.

In some embodiments, battery odometer 110 receives voltage information from voltage sensor 132. In such embodiments, battery odometer 110 analyzes the voltage information to determine voltage-related parameters. For example, battery odometer 110 may analyze voltage information to determine the voltage output of battery cell 105, the voltage drop of battery cell 105 (i.e., the voltage difference between an open circuit voltage of battery cell 105 and the voltage output when battery cell 105 is connected to a resistor of a known resistance (e.g., resistor/fuse 135)), and/or the voltage input of battery 110. Although only a single voltage sensor 132 may be illustrated and described, any number of voltage sensors 132 may be implemented without departing from the contemplated embodiments. For example, battery cell 105 may include multiple voltage sensors 132, for example, a voltage sensor configured to detect the voltage of battery cell 105 and a voltage sensor configured to detect the voltage output of battery cell 105.

Although voltage sensor 132 may be illustrated and described as detecting voltage related to battery cell 105 as a whole, voltage sensor 132 may be configured to detect voltage information related to each one of the one or more of energy units 120. In such embodiments for example, each one of the one or more energy units may have one or more voltage sensors attached thereto.

Although a particular type of voltage sensor may be illustrated and described, voltage sensor 132 may be embodied by any type of voltage sensor capable of implementing one or more of the embodiments discussed herein. For example, voltage sensor 132 may be embodied by a resistive divider voltage sensor, a capacitive divider voltage sensor, a Hall effect voltage sensor, an electrostatic voltage sensor, a piezoelectric voltage sensor, an optical voltage sensor, an inductive voltage sensor, or a fiber optic voltage sensor. Additionally, in embodiments with more than one voltage sensor 132, each one of the multiple voltage sensors 132 may be embodied by the same type of voltage sensors or different types of voltage sensors.

In some embodiments, battery odometer 110 receives current information from current sensor 133. In some embodiments, current sensor 133 may be configured to detect the current output and/or input of battery cell 105. Additionally, each of the one or more energy units 120 may include a current sensor without departing from the contemplated embodiments. In such embodiments, battery odometer 110 may receive current information from each of the one or more energy units 120. Although battery cell 105 may be illustrated and described as including a single current sensor, any number of current sensors may be implemented without departing from the contemplated embodiments. In such embodiments for example, each one of the one or more energy units may have one or more current sensors attached thereto. In such a configuration, battery odometer 110 is able to detect and monitor current information for each one of the one or more energy units 120 as well as the entirety of battery cell 105. For example, battery odometer 110 may detect that a particular energy unit of the one or more energy units 120 is underperforming based on the current information of that particular energy unit, thereby detecting and identifying which of the one or more energy units 120 needs replacement or is otherwise not performing at a particular level.

Additionally, although a single type of current sensor may be illustrated and described, any type of current sensor may be implemented without the parting from the contemplated embodiments. Example types of current sensors that may be used include current transformers, DC-CT platise flux current sensors, fluxgate/zero flux current sensors, open-loop hall effect current sensors, closed-loop hall effect current sensors, fiber-optic currents sensors, shunt resistor current sensors, and Rogowski coil current sensors.

In some embodiments, battery odometer 110 receives temperature information from thermometer 134. In some embodiments, thermometer 134 is configured such that battery odometer 110 determines the temperature of battery cell 105. In other embodiments, thermometer 134 is configured such that battery odometer 110 determines the ambient temperature of the environment in which battery cell 105 is located. In other embodiments, thermometer 134 is configured such that it detects the temperature of one or more energy units 120. Battery odometer 110 may detect and track one or more temperature parameters over time. In some embodiments, battery odometer stores one or more minimum and/or maximum values of battery cell 105. Such information may be stored locally, for example, at memory 112. Although battery cell 105 may be illustrated and described as including a single thermometer, any number of thermometers may be implemented without departing from the contemplated embodiments. Additionally, although a single type of thermometer may be illustrated and described, any type of thermometer may be implemented without the parting from the contemplated embodiments. Example types of thermometers that may be used include digital thermometers, mercury-in-glass thermometers, thermocouples, pyrometers, plastic strip thermometers, liquid-in-glass thermometers, bimetallic strip thermometers, platinum resistance thermometers, and probe thermometers.

In some embodiments, battery odometer 110 optionally includes display 118. In such embodiments, battery odometer 110 may include any type of display, for example, those that support a graphical user interface. Example displays include liquid crystal displays (LCD), light-emitting diode displays (LED), organic light-emitting diode displays (OLED), quantum dot displays (QLED), or any combination thereof. Alternatively or in addition, the display may include lights or lighted switches to convey one or more of the parameters monitored and/or determined by the battery odometer.

In some embodiments, battery cell 105 includes resistor/fuse 135. Although certain embodiments may be illustrated and described as including a resistor or a fuse, battery cell 105 may include resistor 135, fuse 135, or resistor/fuse 135 without departing from the contemplated embodiment.

In other embodiments, battery cell 105 includes capacitor 137. Although certain embodiments may be illustrated and described as including a particular type and/or configuration of capacitor, any suitable type and/or configuration of capacitor(s) may be used without departing from the contemplated embodiments. For example, capacitor 137 may be embodied by ceramic capacitors, film and paper capacitors, aluminum, tantalum, and niobium electrolytic capacitors, polymer capacitors, supercapacitors, and silver mica, glass, silicon, airgap, and vacuum capacitors, or any combination thereof may be implemented without departing from the contemplated embodiments.

In some embodiments, battery odometer 110 uses an AC pulse charge (or simulated AC pulse charge) to determine the internal resistance of battery cell 105 and/or one or more energy units 120. In such an embodiment, battery cell 105 includes an insulated-gate bipolar transistor (IGBT) that applies a simulated AC discharge into one or more energy units 120. Battery odometer 110 uses information gathered during the AC discharge to, e.g., determine the internal resistance (ACIR) of one or more energy units 120. Any type of IGBT may be implemented. For example, a Punch Through IGBT or PT-IGBT (also known as asymmetrical IGBT) and/or a Non-Punch Through IGBT or NPT-IGBT (also known as asymmetrical IGBT), without departing from the contemplated embodiments. Although an IGBT may be illustrated and described as providing the pulse charge to battery cell 105 and/or one or more energy units 120, any device capable of applying a DC or AC (or simulated AC) pulse charge to the battery may be implemented without departing from the contemplated embodiments. For example, a MOSFET, H-Bridge, Full-Bridge, Half-Bridge, PWM controller, as well as SiC, GaN switches, and/or other wideband gap semiconductors may be implemented to effectuate the functionality discussed herein.

As used herein, the term "battery cell" refers to a device that converts chemical energy into electric energy and includes an anode and a cathode separated by an electrolyte and produces voltage and current. A battery cell may contain one or more energy units, each energy unit having an anode and a cathode separated by an electrolyte that produces voltage and current. When a battery cell comprises multiple energy units, the energy units are connected in parallel such that the energy units function as a single energy unit.

FIGS. 2A and 2B illustrate perspective views of two example embodiments of cylindrical-type battery cells having externally and internally integrated battery odometers 210, according to various embodiments of the present disclosure. With reference to FIG. 2A, battery cell 205 includes positive terminal 222 and negative terminal 224. Although positive terminal 222 and negative terminal 224 may be illustrated and described in a specific configuration with respect to battery cell 205, positive terminal 222 and negative terminal 224 may be configured in any manner suitable to implement the embodiments described herein. Battery cell 205 includes battery odometer 210 integrated in battery cell 205. As illustrated, battery odometer 210 is integrated in battery cell 205 by being attached to the exterior of battery cell 205. Although battery odometer 210 may be illustrated and described as being attached to the exterior of battery cell 205, some or all of battery odometer 210 may be located within battery cell 205.

In another example embodiment and with reference to FIG. 2B, battery cell 205 includes battery odometer 210 that is integrated in battery cell 205. Battery cell 205 includes positive terminal 222 and negative terminal 224. As illustrated, battery odometer 210 is located within the jacket or casing of battery cell 205.

Figure 3A:
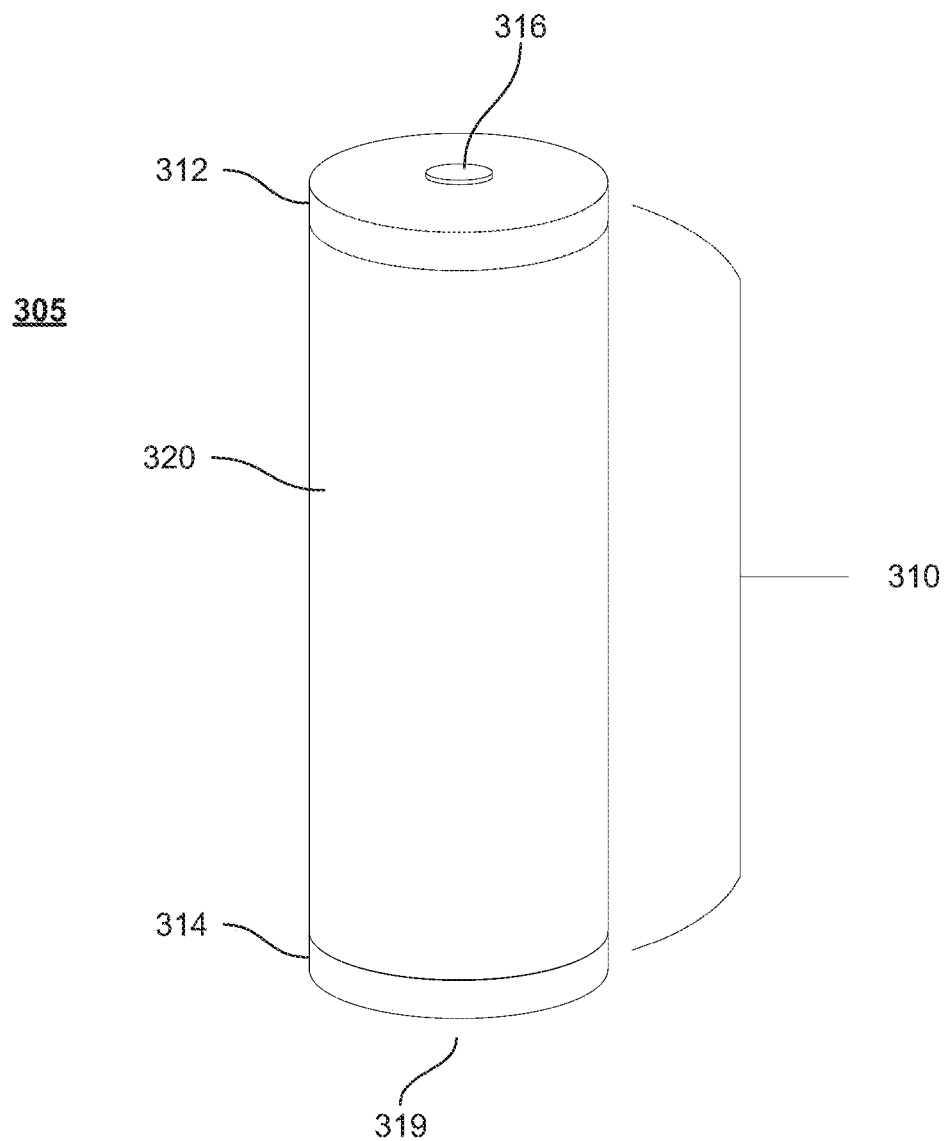
FIGS. 3A-3B illustrate perspective views of an example battery cell with an externally integrated battery odometer, in accordance with various embodiments of the disclosure.
Figure 3B:
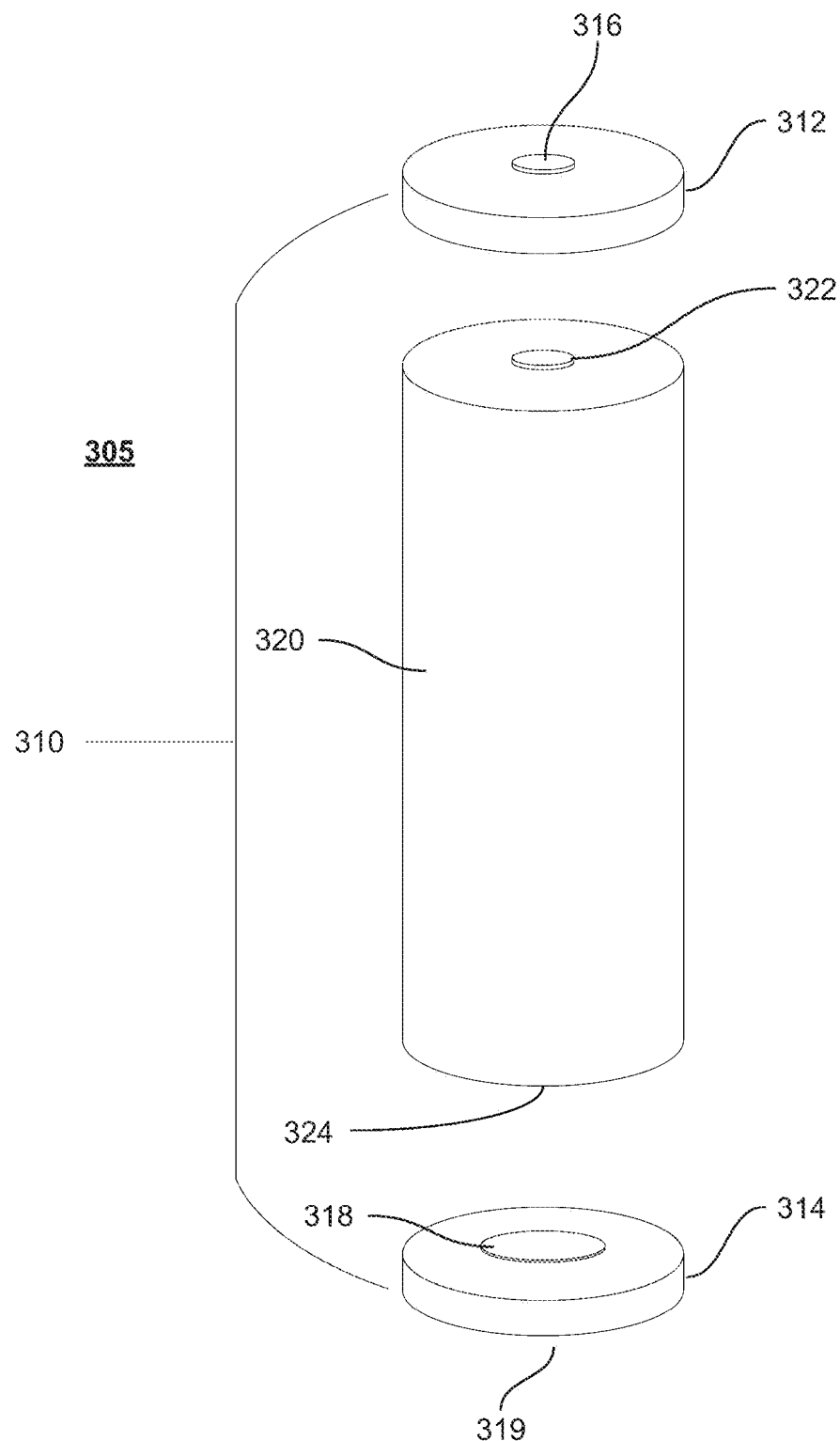

FIGS. 3A and 3B illustrate perspective views of an example battery cell 305 with an externally integrated battery odometer 310, according to various embodiments of the present disclosure. FIG. 3A depicts an illustrative perspective view of battery cell 305 in its assembled state; FIG. 3B depicts an illustrative exploded view of battery cell 305 in a disassembled or preassembly state. As illustrated, battery odometer 310 includes first portion 312 and second portion 314. Battery cell 320 may comprise one or more energy units within its case (not shown). First portion 312 is located near positive terminal 322 of battery cell 320. First portion 312 includes a terminal (not shown) contacting positive terminal 322 and positive terminal 316. Similarly, second portion 314 includes terminal 318 contacting negative terminal 324 and further includes negative terminal 319. As assembled, battery odometer 310 is integrated with battery cell 320 to form battery cell 805. As illustrated, first portion 312 of battery odometer 310 is attached or otherwise affixed to battery cell 320 such that the terminal of first portion 312 contacts positive terminal 322 of battery cell 320. Similarly, second portion 314 is located near negative terminal 324 such that terminal 318 contacts negative terminal 324 of battery cell 320. Although not illustrated, battery odometer 310 may further include various components, for example, memory, control circuitry, input output circuitry, one or more accelerometers, one or more voltage sensors, current sensors, one or more thermometers, and/or one or more resistors or fuses. First portion 312 may communicate with second portion 314 using any wired or wireless communication techniques.

In some embodiments, first portion 312 includes a voltage sensor and a current sensor. Additionally, second portion 314 includes a voltage sensor and a current sensor. In such embodiments, battery odometer 310 determines the voltage of battery cell 320 using the voltage sensors located within the first portion of 312 and second portion of 314. Additionally, battery odometer 310 determines the current input and the current output of battery cell 320 using the current sensors embedded within first portion 312 and/or second portion 314. In this way, battery odometer 310 implements various techniques of the present disclosure. In the illustrated embodiment, battery odometer 310 may be added to existing commercially available battery cells.

Although first portion of 312 may be illustrated and described as being located near positive terminal 322 of battery cell 320, first portion 312 may be located anywhere without departing from the contemplated embodiments. Similarly, although second portion of 314 may be illustrated and described as being located near negative terminal 324 of battery cell 320, second portion of 314 may be located anywhere, without departing from the contemplated embodiment.

Figure 4A:
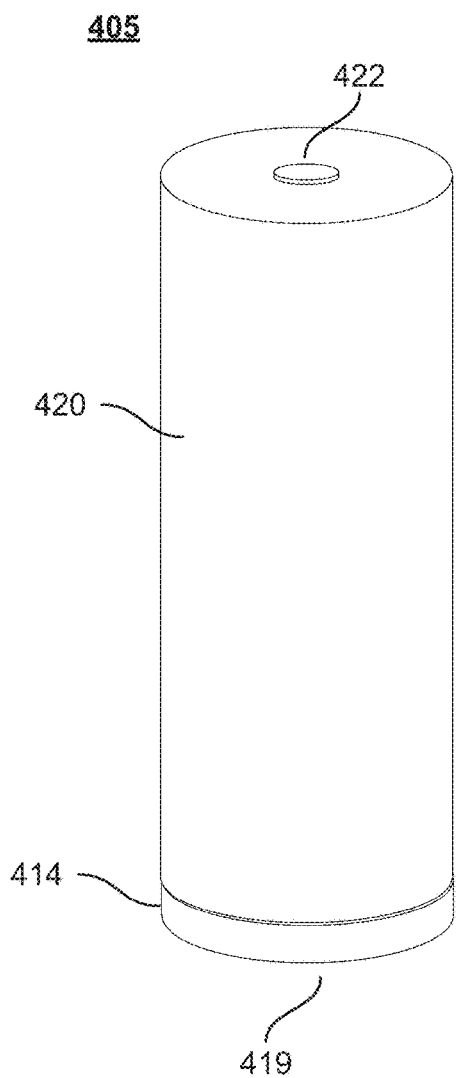
FIGS. 4A-4B depicts illustrative perspective views of example battery cells with externally integrated battery odometers, in accordance with various embodiments of the disclosure.
Figure 4B:
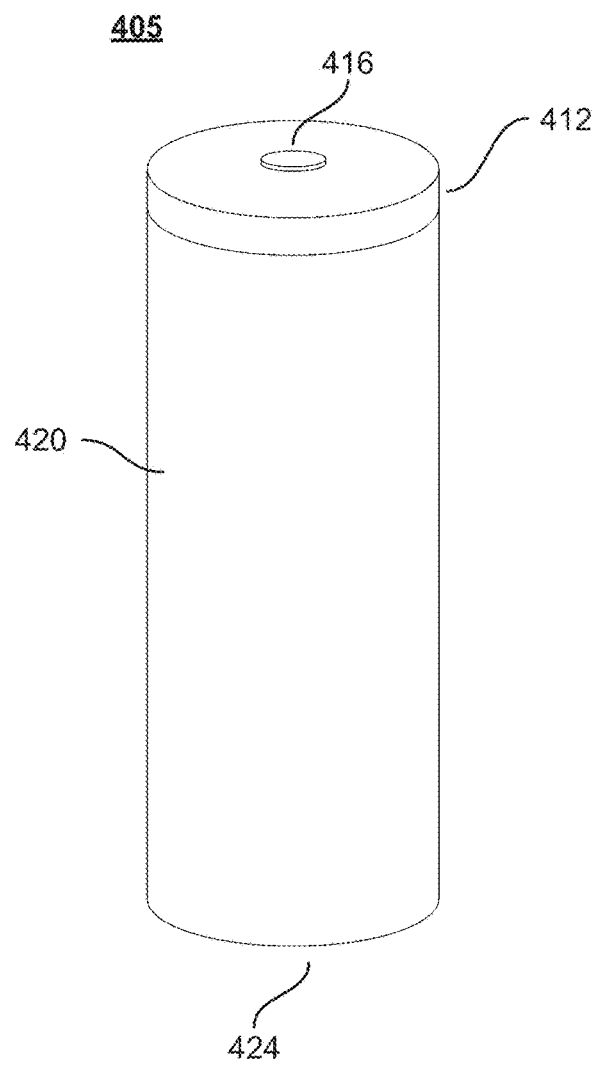

FIGS. 4A and 4B illustrate perspective views of two example embodiments of battery cells 420 with externally integrated battery odometers 412, 414, according to various embodiments of the present disclosure. In an example embodiment and with reference to FIG. 4A, battery cell 405 includes battery cell 420 and battery odometer 414 located near the bottom of battery cell 420 (as illustrated). Although not illustrated, battery odometer 414 may include various components, for example, memory, control circuitry, input output circuitry, one or more accelerometers, one or more voltage sensors, one or more current sensors, one or more thermometers, and/or more resistors or fuses. In some embodiments, battery odometer 414 may optionally include a display. As illustrated, battery odometer 414 is located near negative terminal 424 of battery cell 420. Battery odometer 414 includes terminal 419 (not shown) that contacts negative terminal 424 of battery cell 420.

In another example embodiment and with reference to FIG. 4B, battery cell 405 includes battery cell 420 and battery odometer 412 located near the top of battery cell 420 (as illustrated). Although not illustrated, battery odometer 412 may include various components, for example, memory, control circuitry, input output circuitry, one or more accelerometers, one or more voltage sensors, one or more current sensors, one or more thermometers, one or more resistors, fuses, and/or capacitors. In some embodiments, battery odometer 412 may optionally include a display. Battery odometer 412 is located near positive terminal 422 of battery cell 420. Battery odometer 412 includes positive terminal 416 that contacts positive terminal 422 of battery cell 420. In the illustrated embodiments of FIGS. 4A and 4B, battery odometer 412, 414 may be added to a commercially available battery cell energy unit 420.

Figure 5A:
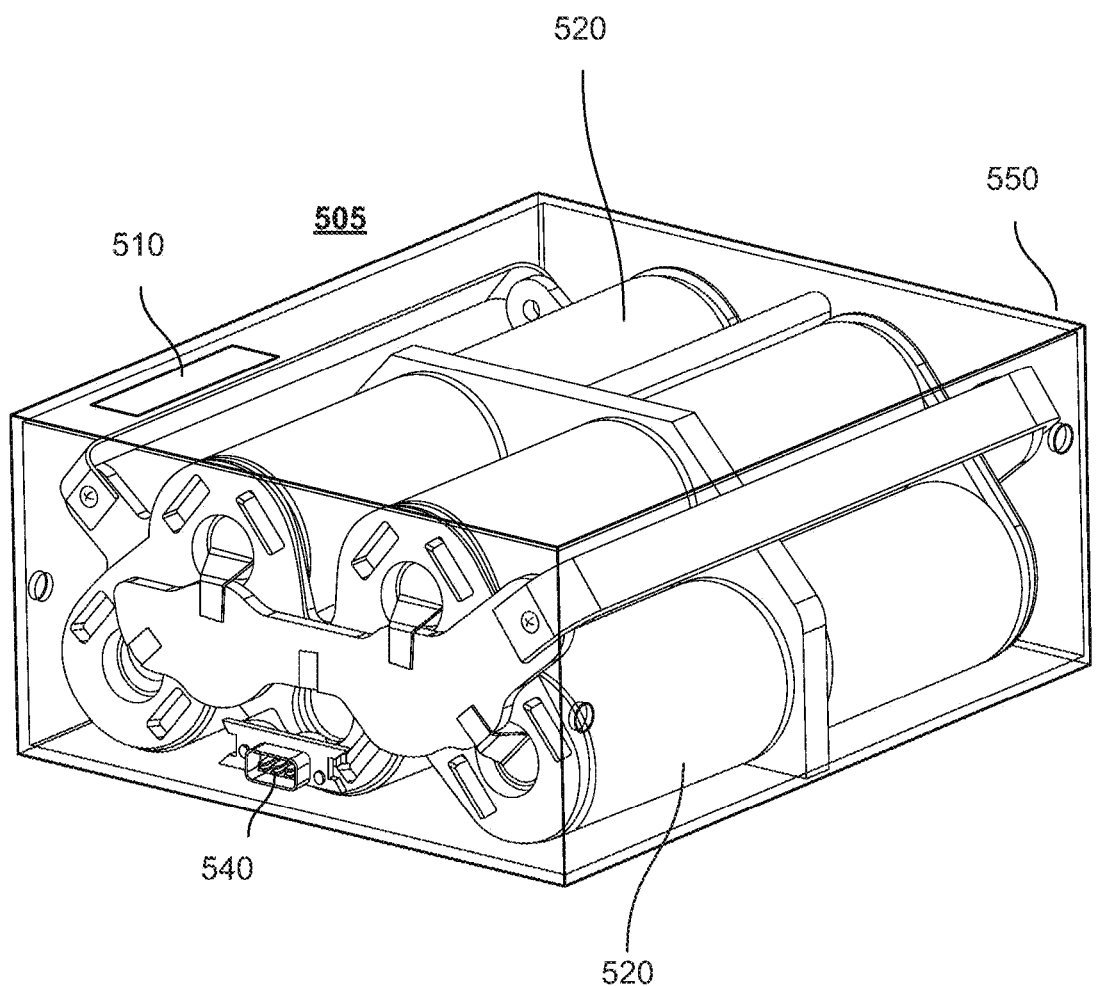
FIGS. 5A-5B depict illustrative perspective views of an example battery cell comprising multiple energy units, in accordance with various embodiments of the disclosure.
Figure 5B:
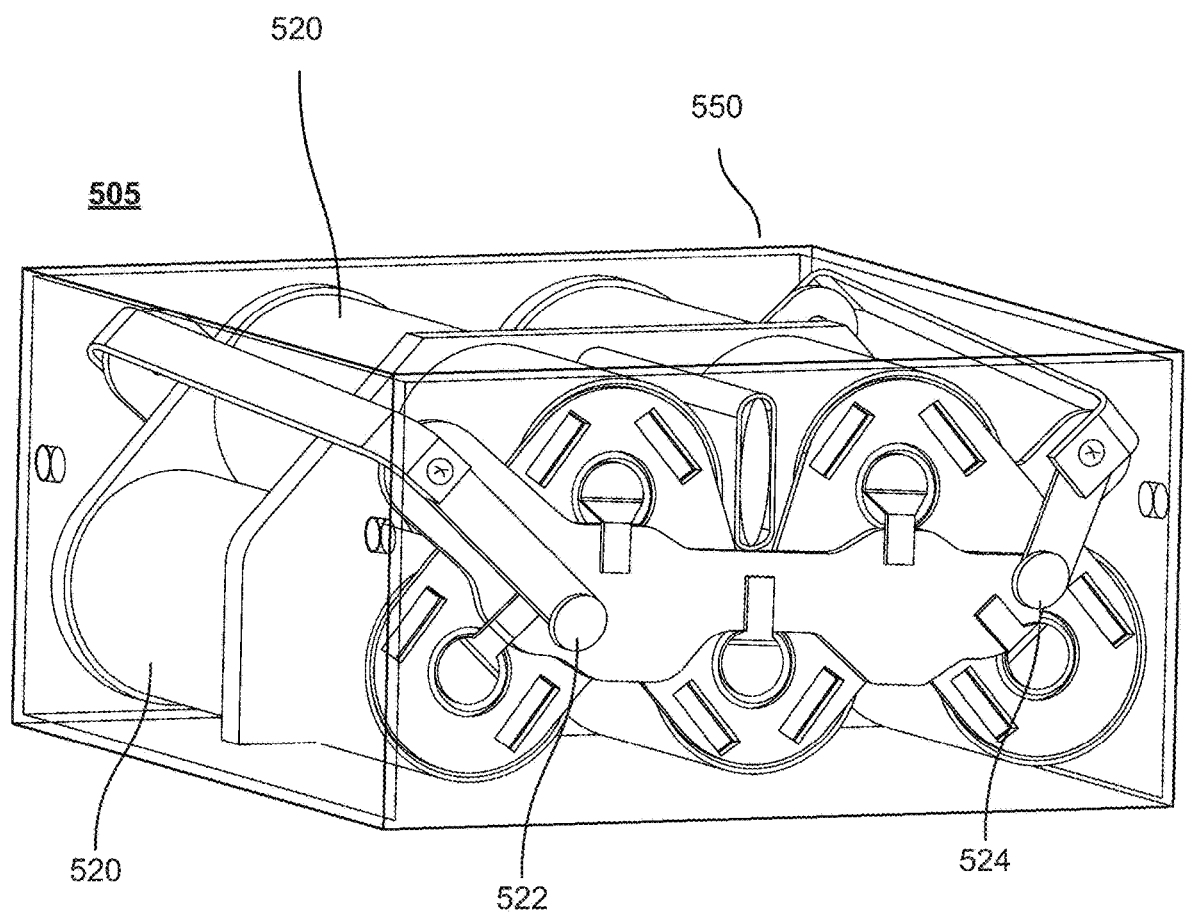

FIGS. 5A and 5B illustrate perspective views of an example battery cell 505 comprising multiple energy units 520, according to various embodiments of the present disclosure. Battery cell 505 includes battery odometer 510, energy units 520, connector 540, case 550, positive terminal 522, and negative terminal 524. Although FIGS. 5A and 5B illustrate perspective views of opposite sides of an example battery cell 505, the features illustrated in FIGS. 5A and 5B may be independently implemented, without departing from the contemplated embodiments. Although battery cell 505 may be illustrated and described as including ten energy units 520, any number of energy units 520 may be implemented without departing from the contemplated embodiments. Energy units 520 are electrically coupled in parallel and function as a single energy unit for battery cell 505. For example, the voltage of energy units 520 corresponds to the voltage of battery cell 505. Battery odometer 510 may include various components, for example, memory, control circuitry, and input-output circuitry. Additionally, battery odometer 510 may optionally include a display. Battery cell 505 may additionally include various components, for example, one or more accelerometers, one or more voltage sensors, one or more current sensors, one or more thermometers, and/or one or more resistors or fuses.

In some embodiments, battery cell 505 includes one or more voltage sensors. In such embodiments, the one or more voltage sensors may be configured to detect the input and/or output voltage of battery cell 505. In other such embodiments, one or more voltage sensors may be configured to detect the input and/or output voltage of one or more energy units 520. In this way, battery cell 505 is able to detect the input and/or output voltage of battery cell 505 and/or the input and/or output voltage of energy units 520.

In some embodiments, battery cell 505 includes one or more current sensors. In such embodiments, the one or more current sensors may be configured to detect the input and/or output current of battery cell 505. In other such embodiments, one or more current sensors may be configured to detect the input and/or output current of one or more energy units 520. In this way, battery cell 505 is able to detect the input and/or output current of battery cell 505 and/or the input and/or output current of any individual energy unit 520.

In some embodiments, battery cell 505 includes one or more accelerometers to detect the acceleration experienced by battery cell 505. The one or more accelerometers may be located within one or more of energy units 520, within battery odometer 510, within the interior of casing 550, on the exterior of casing 550, or any combination thereof. In some embodiments, battery cell 505 includes one or more single-axis accelerometers, e.g., accelerometers that are configured to detect acceleration in one or more of the x-, y-, and z-axes. In other embodiments, battery cell 505 includes a single, multi-axis accelerometer, e.g., a single accelerometer that detects acceleration in the x-, y-, and z-axes.

In some embodiments, battery cell 505 includes one or more thermometers. In such embodiments, the one or more thermometers may be located and/or configured to detect the temperature of various components of battery cell 505. For example, one or more of energy units 520 may include a thermometer that detects the internal temperature of energy unit 520. In another example, battery cell 505 may have one or more thermometers located within case 550 and be configured to detect the temperature of the air or components within case 550. In another example, battery cell 505 includes one or more thermometers configured to detect the ambient temperature in which battery cell 505 is located.

Figure 6A:
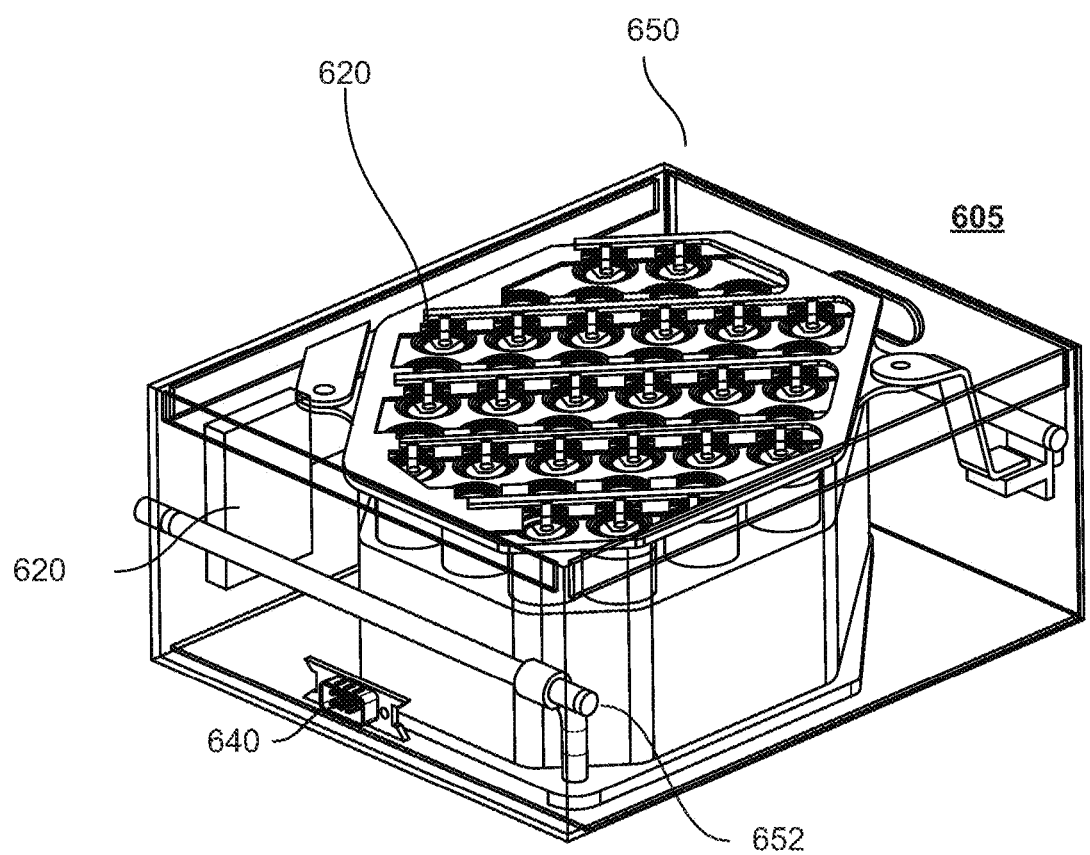
FIGS. 6A-6B depict illustrative two views of an example battery cell comprising multiple energy units, in accordance with various embodiments of the disclosure.
Figure 6B:
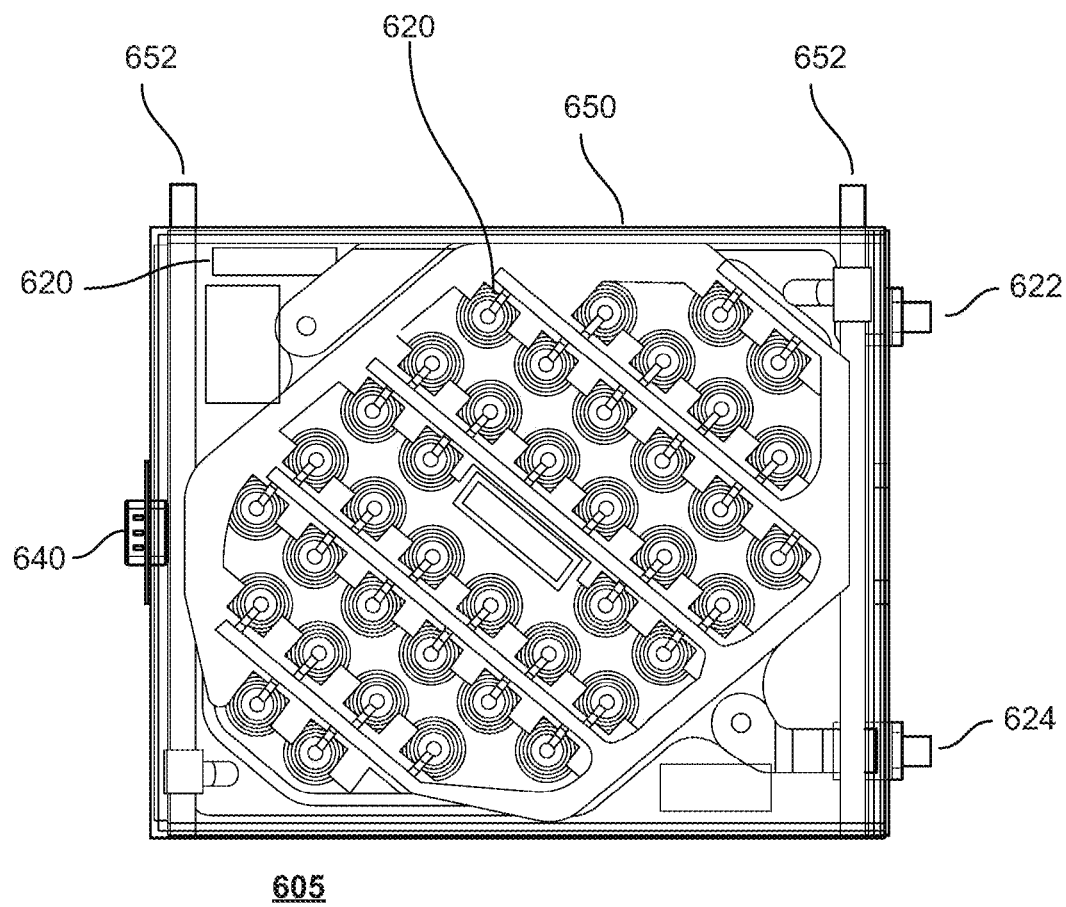

FIGS. 6A and 6B illustrate two views of an example battery cell 605 comprising multiple energy units 620, according to various embodiments of the present disclosure. Battery cell 605 includes battery odometer 620, connector 640, one or more energy units 620, case 650, positive terminal 622, and negative terminal 624. Battery cell 605 additionally includes one or more components, for example, memory, control circuitry, input output circuitry, one or more accelerometers, one or more voltage sensors, one or more current sensors, one or more thermometers, one or more resistors or fuses, or any combination thereof. Battery cell 605 may optionally include a display. In some embodiments, battery cell 605 includes additional components for implementing other features of battery cell 605, for example, cooling passages 652 and busbars and current collectors. Connector 640 may be illustrated and described as a wired port. Connector port 640 may be embodied by any wired or wireless device capable transferring information to and from battery cell 605 (including battery odometer 620), without departing from the contemplated embodiments.

In some embodiments, battery cell 605 includes one or more voltage sensors. In such embodiments, the one or more voltage sensors may be configured to detect the input and/or output voltage battery cell 605. In other such embodiments, one or more voltage sensors may be configured to detect the input and/or output voltage of one or more energy units 620. In this way, battery odometer 620 is able to detect the input and/or output voltage of battery cell 605 and/or the input and/or output voltage of energy units 620.

In some embodiments, battery cell 605 includes one or more current sensors. In such embodiments, the one or more current sensors may be configured to detect the input and/or output current of battery cell 605. In other such embodiments, one or more current sensors may be configured to detect the input and/or output current of one or more energy units 620. In this way, battery odometer 620 is able to detect the input and/or output current of battery cell 605 and/or the input and/or output current of any individual energy unit 620.

In some embodiments, battery cell 605 includes one or more accelerometers to detect the acceleration experienced by battery cell 605. The one or more accelerometers may be located within one or more of energy units 620, within battery odometer 610, within the interior of casing 650, on the exterior of casing 650, or any combination thereof. In some embodiments, battery cell 605 includes one or more single-axis accelerometers, e.g., accelerometers that are configured to detect acceleration in one or more of the x-, y-, and z-axes. In other embodiments, battery cell 605 includes a single, multi-axis accelerometer, e.g., a single accelerometer that detects acceleration in the x-, y-, and z-axes.

In some embodiments, battery cell 605 includes one or more thermometers. In such an embodiment, the one or more thermometers may be located and/or configured to detect the temperature of various components of battery cell 605. For example, one or more of energy units 620 may include a thermometer that detects the internal temperature of energy unit 620. In another example, battery cell 605 may have one or more thermometers located within case 650 and configured to detect the temperature of the air or components within case 650. In another example, battery cell 605 includes one or more thermometers configured to detect the ambient temperature in which battery cell 605 is located. In some embodiments, battery cell 605 corresponds to battery cell 505, but with a different internal configuration of energy units.

Figure 7A:
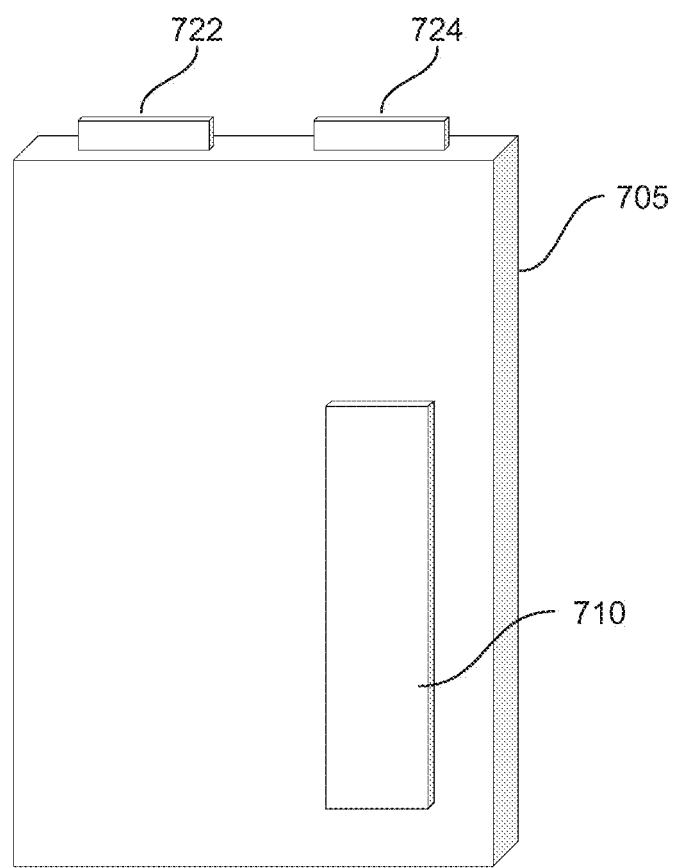
FIGS. 7A-7B depict illustrative perspective views of two example pouch-type or prismatic-type battery cells with externally and internally integrated battery odometers, in accordance with various embodiments of the disclosure.
Figure 7B:
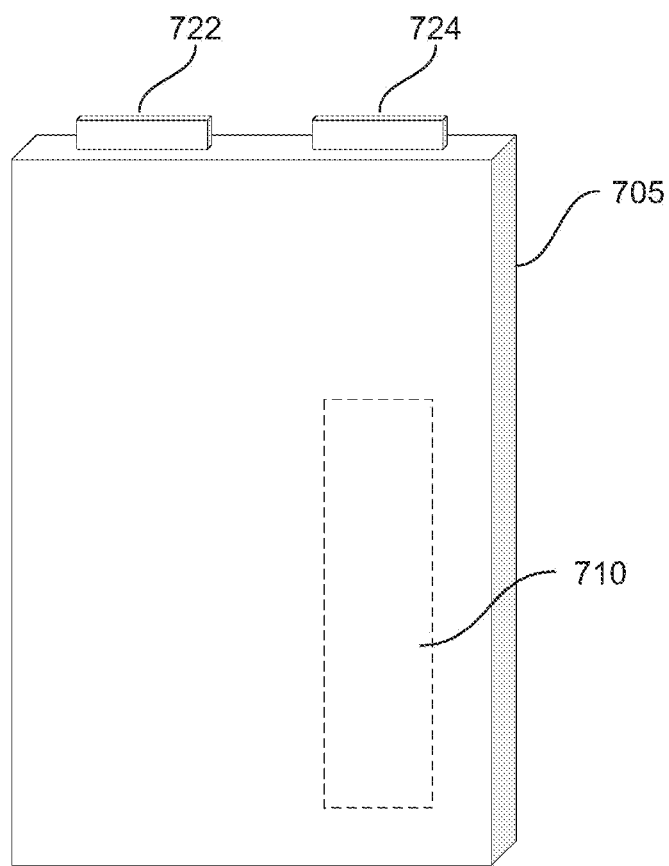

FIGS. 7A and 7B illustrate perspective views of two example embodiments of pouch-type or prismatic-type battery cells 705 having externally and internally integrated battery odometers 710, according to various embodiments of the present disclosure. With reference to FIG. 7A, battery cell 705 includes positive terminal 722 and negative terminal 724. Although positive terminal 722 and negative terminal 724 may be illustrated and described in a specific configuration with respect to battery cell 705, positive terminal 722 and negative terminal 724 may be configured in any manner suitable to implement the features described herein. Battery cell 705 includes battery odometer 710 integrated in battery cell 705. As illustrated, battery odometer 710 is integrated in battery cell 705 by being attached to the exterior of battery cell 705. Although battery odometer 710 may be illustrated and described as being attached to the exterior of battery cell 705, some or all of battery odometer 710 may be located within battery cell 705.

In another example embodiment and with reference to FIG. 7B, battery cell 705 includes battery odometer 710 that is integrated in battery cell 705 by being located within the jacket or casing of battery cell 705. Battery cell 705 includes positive terminal 722 and negative terminal 724. As illustrated, battery odometer 710 is integrated in battery cell 705 by being located entirely within battery cell 705.

Figure 8A:
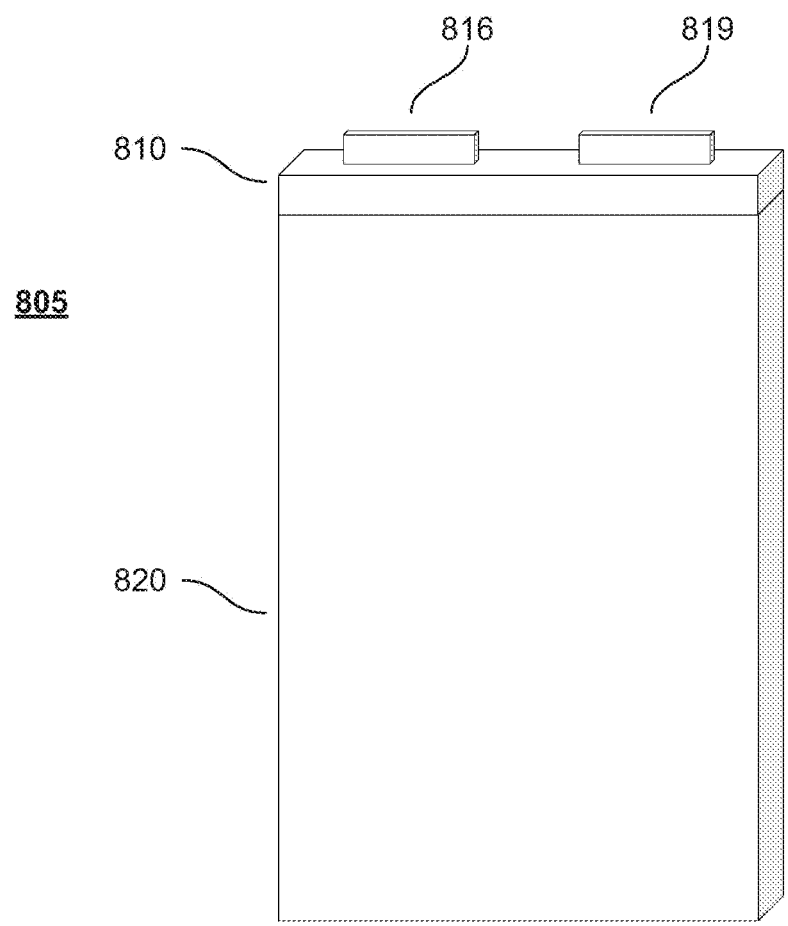
FIGS. 8A-8B depict illustrative perspective views of an example pouch-type or prismatic battery cell with an externally integrated battery odometer, in accordance with various embodiments of the disclosure.
Figure 8B:
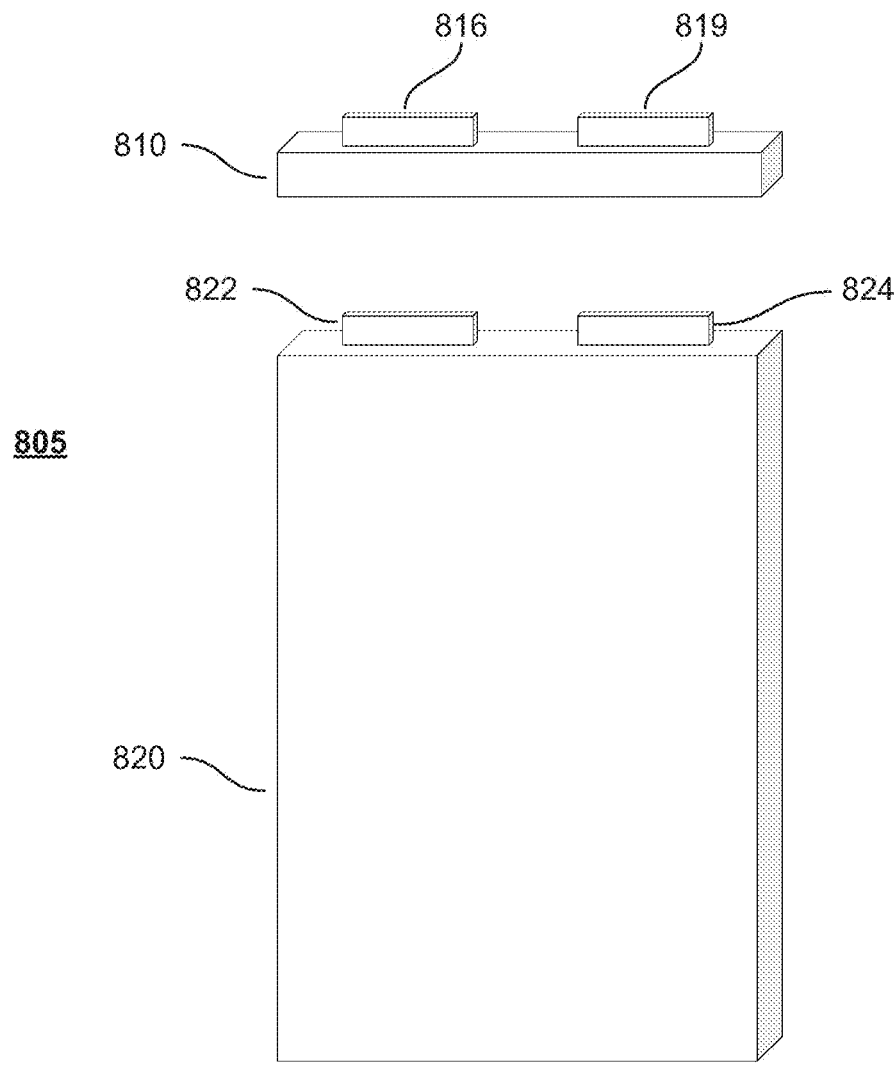

FIGS. 8A and 8B illustrate perspective views of an example battery cell 805 with an externally integrated battery odometer 810, according to various embodiments of the present disclosure. FIG. 8A depicts an illustrative perspective view of battery cell 805 in its assembled state; FIG. 8B depicts an illustrative exploded view of battery cell 805 in a disassembled or preassembly state. As illustrated, battery odometer 810 is affixed or otherwise attached to energy unit 830. In some embodiments and as illustrated, battery odometer 810 is located near the top of battery cell 820 and connects to positive terminal 822 and negative terminal 824 of battery cell 820. Battery odometer 810 includes a terminal (not shown) contacting positive terminal 822. Similarly, battery odometer 810 includes a terminal (not shown) contacting negative terminal 824. Battery odometer 810 includes positive terminal 816 and negative terminal 819.

As illustrated in FIG. 8A, battery odometer 810 is externally integrated with battery cell 820 to form battery cell 805. Battery odometer 810 is attached or otherwise affixed to battery cell 820 such that the positive contact terminal (not shown) of battery odometer 810 contacts positive terminal 822 of battery cell 820. Similarly, negative terminal (not shown) of battery odometer 810 contacts negative terminal 824 of battery cell 820. Although not illustrated, battery odometer 810 may further include various components, for example, memory, control circuitry, input output circuitry, one or more accelerometers, one or more voltage sensors, current sensors, one or more thermometers, and/or one or more resistors or fuses.

In some embodiments, battery odometer 810 includes a voltage sensor and a current sensor configured to detect the voltage and current related to positive terminal 822 and/or negative terminal 824. In such embodiments, battery odometer 810 determines the voltage of battery cell 820 using the voltage sensors located within battery odometer 810. Additionally, battery odometer 810 determines the current input and/or the current output of battery cell 820 using the current sensors embedded within battery odometer 810. In this way, battery odometer 810 implements various techniques of the present disclosure. In the illustrated embodiment, battery odometer 810 may be added to existing commercially available pouch-type or prismatic-type battery cells.

Although battery odometer 810 is illustrated and described as being located near the terminals of battery cell 820, battery odometer 810 may be located anywhere on or within battery cell 820 without departing from the contemplated embodiments.

Figure 9A:
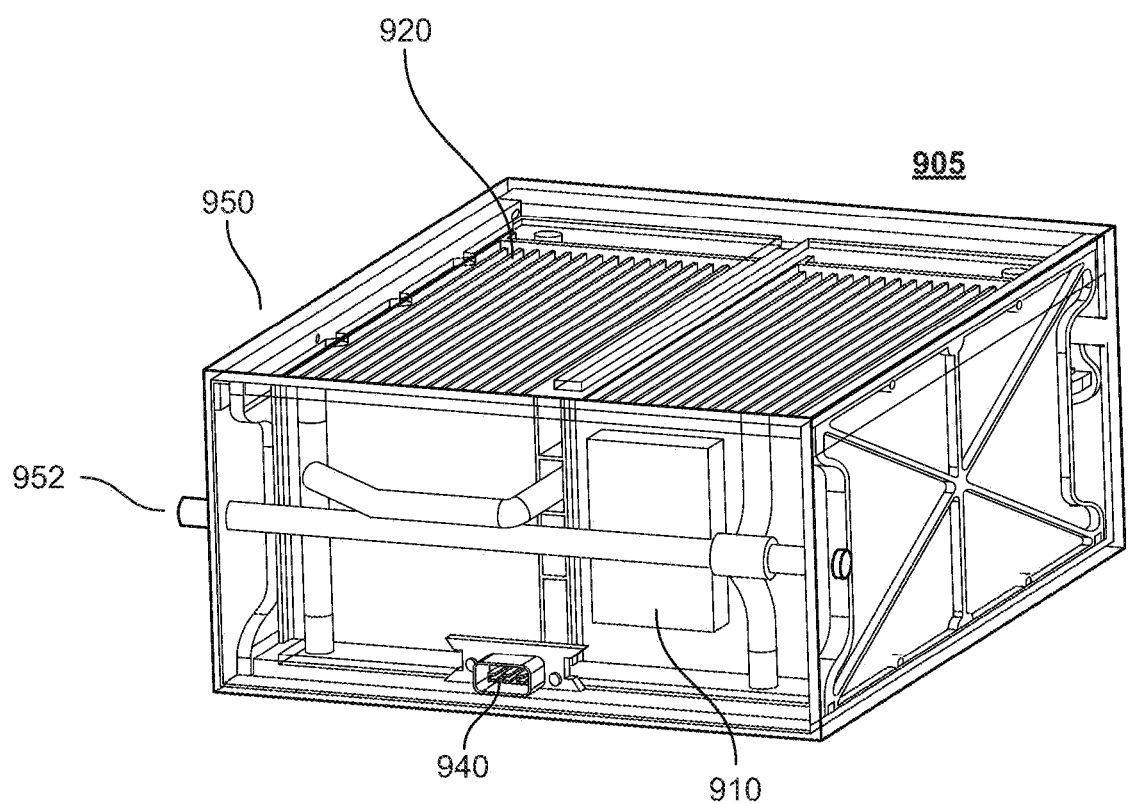
FIGS. 9A-9B depict illustrative perspective views of an example battery cell comprising multiple energy units, in accordance with various embodiments of the disclosure.
Figure 9B:
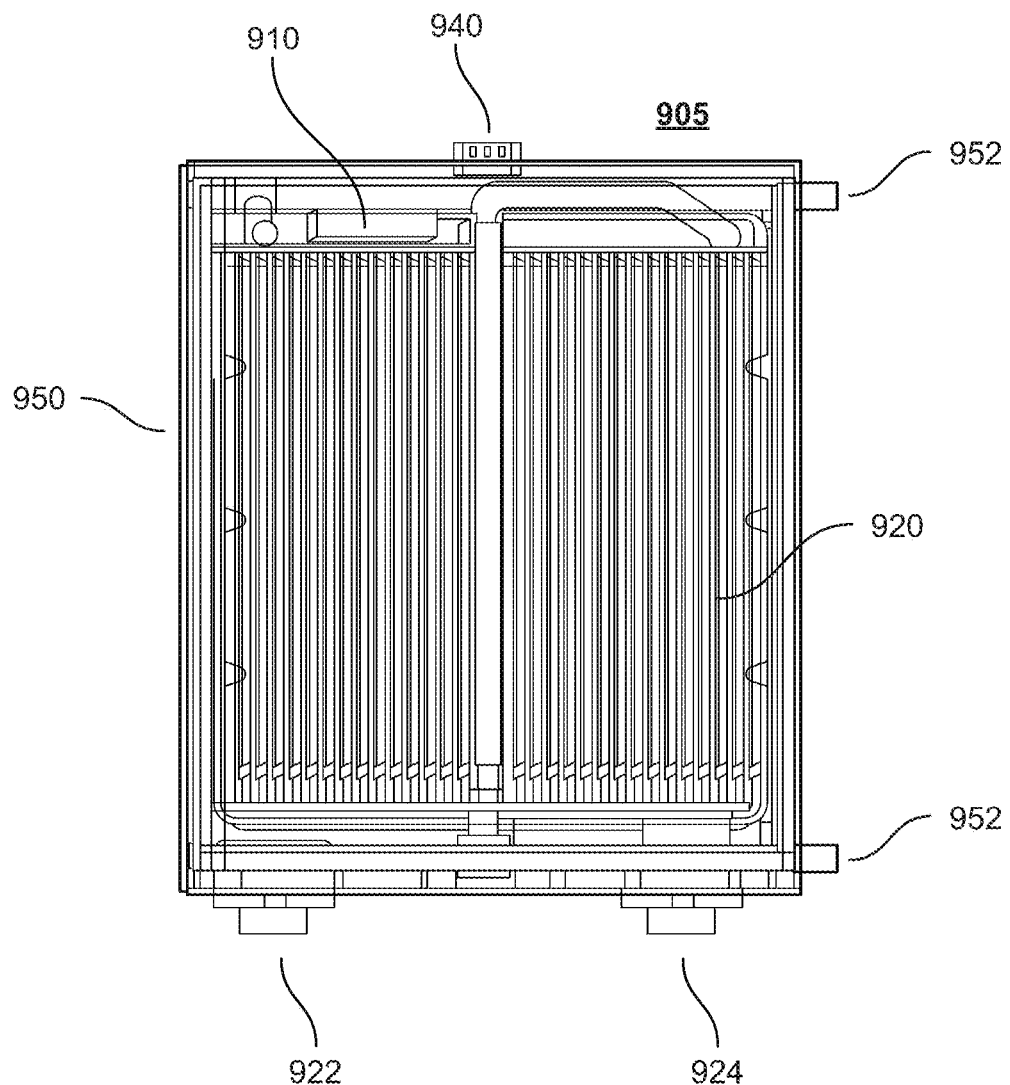

FIGS. 9A and 9B illustrate perspective view of an example battery cell 905 comprising multiple pouch-type energy units 920, according to various embodiments of the present disclosure. In some embodiments, battery cell 905 includes energy units 920, battery odometer 910, connector 940, case 950, positive battery terminal 922 and negative battery terminal 924.

Battery odometer 910 may include various components, for example, memory, control circuitry, and input-output circuitry. Additionally, battery cell 905 may optionally include a display. In some embodiments, battery cell 905 may additionally include various sensors, for example, one or more accelerometers, one or more voltage sensors, one or more current sensors, one or more thermometers, or one or more resistors or fuses, or any combination thereof.

In some embodiments, battery cell 905 includes one or more voltage sensors. In such embodiments, the one or more voltage sensors may be configured to detect the input and/or output voltage battery cell 905. In other such embodiments, one or more voltage sensors may be configured to detect the input and/or output voltage of one or more energy units 920. In this way, battery cell 905 is able to detect the input and/or output voltage of battery cell 905 and/or the input and/or output voltage of energy units 920.

In some embodiments, battery cell 905 includes one or more current sensors. In such embodiments, the one or more current sensors may be configured to detect the input and/or output current of battery cell 905. In other such embodiments, one or more current sensors may be configured to detect the input and/or output current of one or more energy units 920. In this way, battery cell 905 is able to detect the input and/or output current of battery cell 905 and/or the input and/or output current of any individual energy unit 920.

In some embodiments, battery cell 905 includes one or more accelerometers to detect the acceleration experienced by battery cell 905. The one or more accelerometers may be located within one or more of energy units 920, within battery odometer 910, within the interior of casing 950, on the exterior of casing 950, or any combination thereof. In some embodiments, battery cell 905 includes one or more single-axis accelerometers, e.g., accelerometers that are configured to detect acceleration in one or more of the x-, y-, and z-axes. In other embodiments, battery cell 905 includes a single, multi-axis accelerometer, e.g., a single accelerometer that detects acceleration in the x-, y-, and z-axes.

In some embodiments, battery cell 905 includes one or more thermometers. In such an embodiment, the one or more thermometers may be located and/or configured to detect the temperature of various components of battery cell 905. For example, one or more of energy units 920 may include a thermometer that detects the internal temperature of energy unit 920. In another example, battery cell 905 may have one or more thermometers located within case 950 and configured to detect the temperature of the air or components within case 950. In another example, battery cell 905 includes one or more thermometers configured to detect the ambient temperature in which battery cell 905 is located.

In some embodiments, battery cell 905 includes additional structures and components. For example, battery cell 905 may include cooling tubes 952, busbars, and other components to implement the techniques described herein. In some embodiments, battery cell 905 corresponds to battery cells 505 and 605, but with a different internal configuration of energy units.

Figure 10:
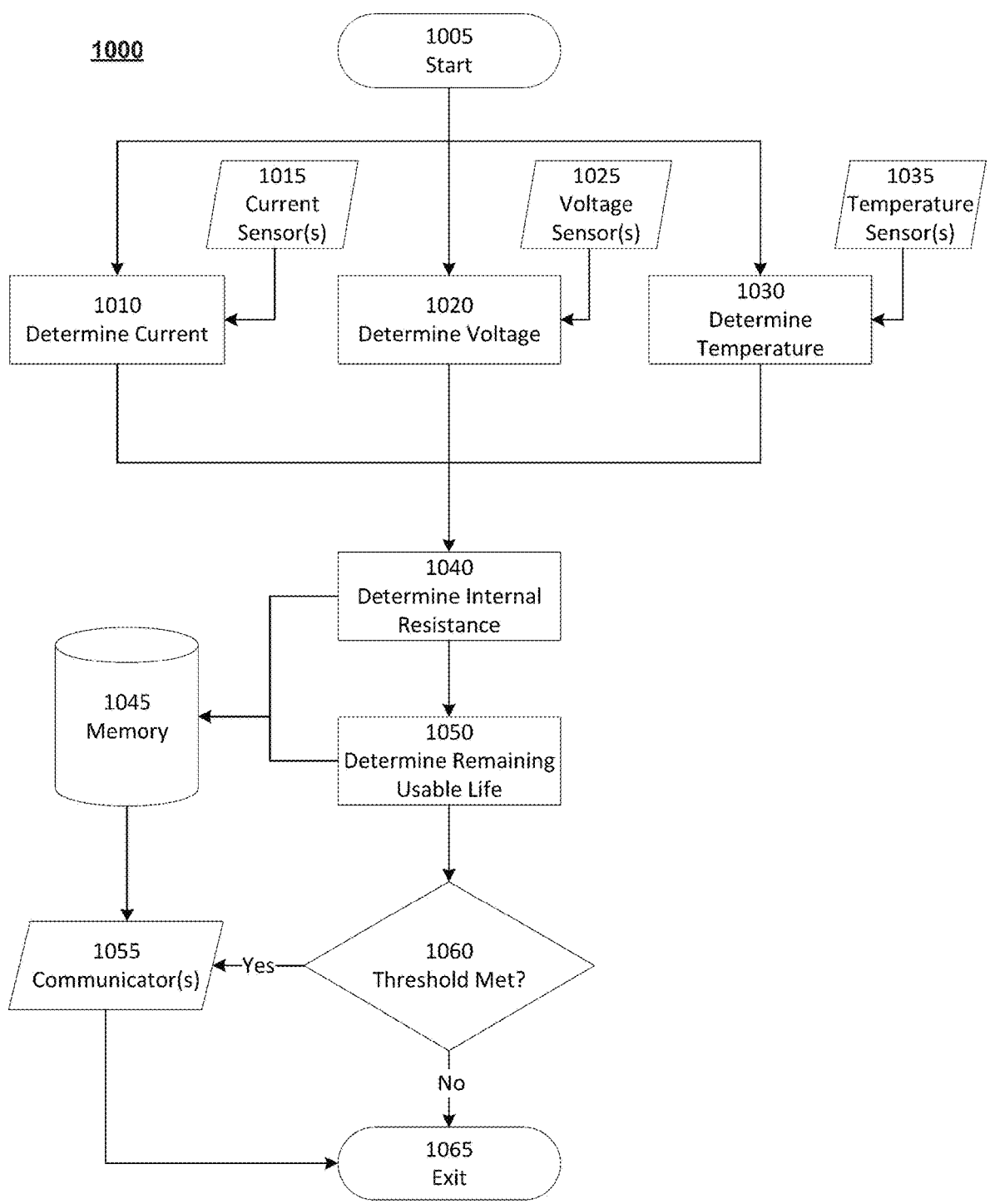
FIG. 10 depicts an illustrative process of an example energy monitoring system, in accordance with embodiments of the disclosure.

FIG. 10 illustrates an exemplary process for monitoring certain parameters of an energy system, according to various embodiments of the present disclosure. At 1005 process 1000 starts. In some embodiments, process 1000 starts based on user input. In other embodiments, process 1000 starts based on the occurrence of a catalyzing event. For example, process 1000 may start once a unit of time has elapsed. In such an example, process 1000 may be undertaken once per second, once per minute, once per hour, once per day, once per week, once per month, or any combination thereof.

At 1010, process 1000 determines current based on current information received from one or more current sensors 1015 (e.g., current sensors 133, 1135). In some embodiments, process 1000 determines the current flow into the battery cell at which the one or more current sensors 1015 are installed. In other embodiments, process 1000 determines the current flow out of the battery cell at which the one or more current sensors 1015 are installed. Additionally or alternatively, process 1000 may determine the current into and/or out of one or more energy units of the battery cell. One or more of the parameters considered or determined at 1010 may be stored, for example, at memory 1045.

At 1020, process 1000 determines voltage of the battery cell based on voltage information received from one or more voltage sensors 1025 (e.g., voltage sensor 132, 1115). In some embodiments, process 1000 determines the voltage of the battery cell at which the one or more voltage sensors 1025 are installed. In some embodiments, process 1000 determines the voltage of the battery cell without resistance (referred to as open circuit voltage). Process 1000 may alternatively or additionally determine the voltage of the battery cell with a known resistance. In such embodiments, process 1000 may compare the open circuit voltage to the voltage determined with the known resistance, thereby determining the voltage drop of the battery cell. In some embodiments, process 1000 uses a fuse of the battery cell as the known resistance when determining the voltage drop. In other embodiments, a capacitor (e.g., capacitor 137 as discussed with respect to FIG. 1) may be used to apply a pulse charge into the battery cell to determine the cell's charge internal resistance. In other embodiments, an IGBT may be used to apply a pulse charge to the battery cell to determine the cell's internal resistance. Although techniques of determining voltage may be illustrated and discussed with respect to determining the voltage of a battery cell, such techniques may be applied to determining various voltage parameters for one or more of the energy units of the battery cell. For example, process 1000 may determine the voltage of one or more energy units of the battery cell. One or more of the parameters considered or determined at 1020 may be stored, for example, at memory 1045.

At 1030, process 1000 determines temperature based on temperature information received from one or more temperature sensors 1035 (e.g., temperature sensor 134). In some embodiments, process 1000 determines the internal temperature of one or more of the energy units of the battery cell. In other embodiments, process 1000 determines the temperature of the air within the battery cell. In other embodiments, process 1000 determines the temperature of cooling fluid used to cool components of the battery cell. In yet other embodiments, process 1000 determines the ambient temperature of the environment in which the battery cell is located. One or more of the parameters considered or determined at 1030 may be stored, for example, at memory 1045.

At 1040, process 1000 determines the internal resistance of the battery cell. For example, process 1000 may consider determined voltage parameters (for example, those discussed with respect to 1020) and determined current parameters (for example, those discussed with respect to 1010) to determine the internal resistance of the battery cell. In some embodiments, process 1000 implements the following equation to determine the battery cell's internal resistance (ISR):

$$ISR = \left(\frac{V_1 - V_2}{V_2}\right)R$$

where
$V_1$=Voltage Without Resistance (i.e., Open Circuit Voltage)
$V_2$=Voltage with Known Resistance
R=Known Resistance In some embodiments, the internal resistance of a battery cell may vary based on the battery cell's state of charge. Thus, in some embodiments, process 1000 determines the battery cell's internal resistance at varying states of charge. In such embodiments, process 1000 may use a capacitor (e.g., capacitor 137 as discussed with respect to FIG. 1) to apply the voltage to the battery cell. In such embodiments, the capacitor may be configured to charge the capacitor during normal use and store that energy to apply a pulse discharge into the battery cell. Such embodiments enable process 1000 to determine the battery cell's charge internal resistance.

In some embodiments, process 1000 determines the internal resistance of the battery cell using an AC pulse discharge. For example, process 1000 may consider determined voltage parameters (for example, those discussed with respect to 1020) and determined current parameters (for example, those discussed with respect to 1010) to determine the internal resistance of the battery cell. In some embodiments, process 1000 implements the following equation to determine the battery cell's AC internal resistance (ACIR):

$$ACIR = \frac{V_2 - V_1}{I_2 - I_1}$$

where
$V_1$=Voltage Without Resistance (i.e., Open Circuit Voltage)
$V_2$=Voltage with Known Resistance
$I_1$=Current Without Resistance (i.e., 0)
$I_2$=Current with Known Resistance In some embodiments, process 1000 additionally or alternatively determines the conductance of the battery cell. Conductance is a measure of the ease with which electric current flows through the materials of the battery cell. Conductance (G) may be expressed as the inverse of the internal resistance:

$$G = \frac{1}{ISR} = \frac{V_2}{R(V_2 - V_2)}$$

where
$V_1$=Voltage Without Resistance (i.e., Open Circuit Voltage)
$V_2$=Voltage with Known Resistance
R=Known Resistance One or more of the parameters considered or determined at 1040 may be stored, for example, at memory 1045.

At 1050, process 1000 determines the remaining useable life of the battery cell. In some embodiments, process 1000 considers voltage parameters (e.g., those discussed with respect to 1010), current parameters (e.g., those discussed with respect to 1020), temperature parameters (e.g., those discussed with respect to 1030), internal resistance/conductance (e.g., as discussed with respect to 1040), or any combination thereof.

In some embodiments, process 1000 determines a single alphanumerical value indicative of the remaining useable life of the battery cell (e.g., A-F, 1-10, 1-100, etc.). In such embodiments, process 1000 may weight one or more of the various parameters such that it has a higher or lower impact on the remaining useable life value. For example, process 1000 may weight internal cell resistance such that it has a higher impact on the value than the voltage output of the battery cell. Although weighting a single parameter higher or lower is discussed, process 1000 may weight any number of parameters to any degree, without departing from the contemplated embodiments. Although remaining useful life may be discussed as being expressed as an alpha numeric value, the remaining useful life of the battery may be expressed using any applicable parameters. For example, the remaining useful life may be expressed as a percentage, in terms of amp-hours, as a length of time, or any combination thereof.

Memory illustrated and described with respect to 1045 may be any type of storage device. For example, one or more of the parameters and/or information discussed herein may be stored locally (e.g., at a memory or storage device located at the battery cell) or remotely (e.g., at a memory or storage device not located at the battery cell). Moreover, memory may be embodied by any device capable of storing information, including a hard drive, a flash drive, magnetic storage, optical storage, etc., or any combination thereof. Additionally, information retrieved from sensors or other data sources that are not located at the battery cell may be stored on memory at 1045. For example, a storage device local to a battery cell may store information obtained from sensors located at other battery cells. In such an array configuration, a single storage device at a particular battery cell may store information related to other battery cells.

At 1060, process 1000 determines whether threshold(s) is/are met. In various embodiments, process 1000 may consider thresholds for one or more parameters. For example, process 1000 may consider one or more thresholds related to voltage, current, temperature, charge-discharge cycles, internal resistance, or any combination thereof.

In an example embodiment, process 1000 determines whether the voltage output of the battery cell drops below a minimum threshold of, for example, 2.50 volts. In such an embodiment, process 1000 considers information from one or more voltage sensors (e.g., as discussed with respect to 1020) and compares that information to the minimum threshold value. If the voltage information indicates that the voltage output of the battery cell is below 2.50 volts, process 1000 may send that information to communicator 1055, which may then generate a notification. In some embodiments, process 1000 may store the notification and/or information relating to the low voltage condition (e.g., the voltage minimum threshold, the detected voltage information, the time and/or date of the occurrence, notification information, the number of charge-discharge cycles preceding or otherwise related to the low voltage condition, current and/or temperature information related to the low voltage condition, or any combination thereof).

In another example embodiment, process 1000 determines whether the voltage output of the battery cell exceeds a maximum threshold of, for example, 3.70 volts. In such an embodiment, process 1000 considers information from one or more voltage sensors (e.g., as discussed with respect to 1020) and compares that information to the maximum threshold value. If the voltage information indicates that the voltage output of the battery cell exceeds 3.70 volts, process 1000 may send that information to communicator 1055, which may then generate a notification. In some embodiments, process 1000 may store the notification and/or information relating to the high voltage condition (e.g., the voltage maximum threshold, the detected voltage information, the time and/or date of the occurrence, notification information, the number of charge-discharge cycles preceding or otherwise related to the high voltage condition, current and/or temperature information related to the high voltage condition, or any combination thereof). In some embodiments, process 1000 may optionally implement actions based on the voltage condition. For example, if process 1000 determines that the voltage maximum has been reached, process 1000 may implement a safety measure, for example, causing the battery cell to be disconnected from the system, thereby electrically isolating the battery cell.

Although a particular minimum and maximum voltage value may be illustrated and described, any appropriate minimum or maximum value may be implemented without departing from the contemplated embodiments. For example, the minimum or maximum voltage value may depend on the type of battery cell, the configuration of the battery cell, environmental conditions, the useful remaining life of the battery cell, or any other factor relevant of the battery cell's performance, or any combination thereof.

In some embodiments, process 1000 may undertake an action based on the determined voltage condition. In such an embodiment, process 1000 may, for example, display a low voltage notification at a display associated with the battery cell, schedule the battery cell for recharge, implement recharging of the battery cell, disconnect and/or connect the battery cell from an electrical network, or any combination thereof.

In another example embodiment, process 1000 determines whether the current output of the battery cell exceeds a maximum threshold of, for example, 300 milliamps. In such an embodiment, process 1000 considers information from one or more current sensors (e.g., as discussed with respect to 1010) and compares that information to the maximum threshold value. If the current information indicates that the current output of the battery cell exceeds 400 amps, process 1000 may send that information to communicator 1055, which may then generate and send a notification. In some embodiments, process 1000 may store the notification and/or information relating to the high current condition (e.g., the current maximum threshold, the detected current information, the time and/or date of the occurrence, notification information, the number of charge-discharge cycles preceding or otherwise related to the high current condition, voltage and/or temperature information related to the high current condition, or any combination thereof). In some embodiments, process 1000 may undertake an action based on the determined current condition. In such an embodiment, process 1000 may, for example, display a high current notification at a display associated with the battery cell, schedule the battery cell for maintenance, implement discharging of the battery cell, disconnect and/or connect the battery cell from an electrical network, or any combination thereof.

Although a discharge threshold of 300 milliamps may be illustrated and described, any applicable minimum and/or maximum may be implemented without departing from the contemplated embodiments. For example, minimums and maximum in terms of amps or amp-hours may be implemented. Alternatively, applicable minimums and maximums may be implemented as a factor of the battery cell's capacity charged or discharged over a given amount of time. In such an example embodiment, the maximum discharge may be set at 2 times the capacity of a battery. In such an embodiment where the battery capacity (C) is 1000 mA, an example maximum discharge may be set as 2C or discharging the 1000 mA hour battery over 30 minutes. Additionally, applicable minimums and maximums may vary depending on many factors. For example, the minimums and maximums implemented may vary depending on the type of battery, the remaining useful life of the battery, the state of charge of the battery, the temperature of the battery, the capacity of the battery, the age of the battery, historical information relevant to the battery, or any other applicable factor, or any combination thereof.

Although certain thresholds may be illustrated and described herein as relating to voltage or current, any threshold value relating to any parameter relevant to process 1000 or a battery cell may be considered without departing from the contemplated embodiments. For example, process 1000 may consider maximum and minimum thresholds for relating to temperature information, internal resistance, conductance, remaining useable life, charge-discharge cycles, throughput watt hours, or any combination thereof. Additionally, relevant thresholds considered by process 1000 are not limited to absolute values. For example, process 1000 may consider a percentage and/or a root mean square (RMS) value as a minimum or maximum threshold.

Moreover, maximum or minimum threshold values may be dependent on other values. For example, process 1000 may consider a combination of temperature and current when assessing whether a threshold is met. In another example, process 1000 may adjust thresholds based on other information. For example, a current threshold for a battery cell at a higher temperature may be different than a current threshold for the same battery cell at a lower temperature. In another example, process 1000 may adjust (e.g., raise or lower) threshold values based on, for example, a number of charge-discharge cycles. In such an example, process 1000 may lower a minimum threshold value for a voltage output for a battery cell that has experienced a high number of charge-discharge cycles. Conversely, process 1000 may raise a voltage output minimum threshold for a battery cell that has experienced little to no charge discharge cycles (i.e., the battery is new).

In the event that process 1000 determines that a threshold is not met, process 1000 continues to 1065 where process 1000 exits.

One or more of the steps discussed with respect to FIG. 10 may be implemented at various control circuitry devices, for example, control circuitry 114. Additionally, such steps may be undertaken by one or more devices, for example, battery odometer 110, 210, 310, 510, 610, 710, 810, 910, 1010, 1110. The steps may be undertaken when monitoring a battery cell, for example, battery cell 105, 305, 320, 405, 420, 505, 605, 705, 805, 820, 905; and/or when monitoring individual energy units, for example, energy unit 120, 520, 620, 920, 1020, 1120.

Figure 11:
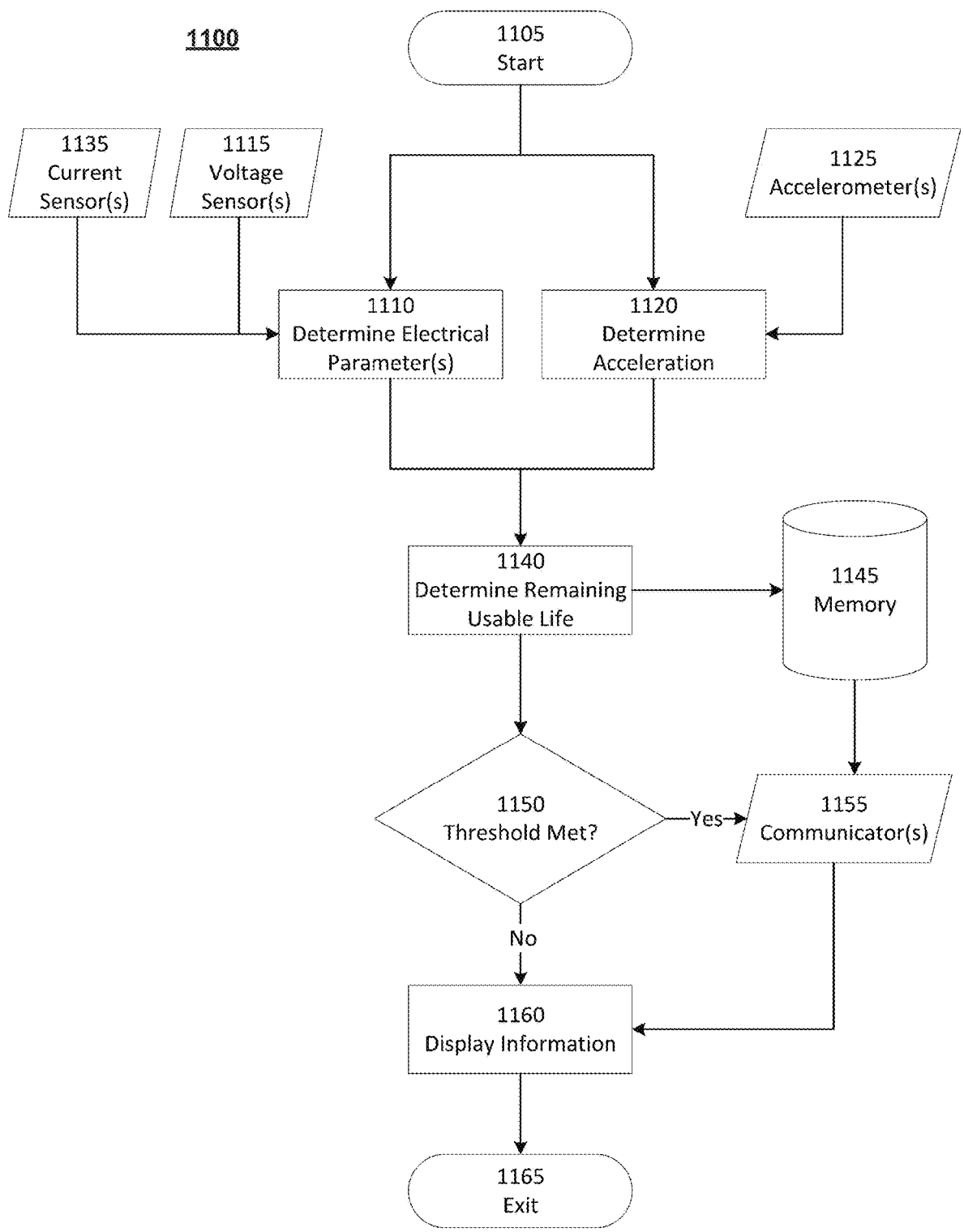
FIG. 11 depicts an illustrative process of an example energy monitoring system, in accordance with embodiments of the disclosure.

FIG. 11 illustrates an exemplary process for an energy system, according to various embodiments of the present disclosure. At 1105 process 1100 starts. In some embodiments, process 1100 starts based on user input. In other embodiments, process 1100 starts based on the occurrence of a catalyzing event. For example, process 1100 may start once a unit of time has elapsed. In such an example, process 1100 may be undertaken once per second, once per minute, once per hour, once per day, once per week, once per month, or any combination thereof.

At 1110, process 1100 determines electrical parameter(s) based on information received from one or more sensors, for example, current sensor(s) 133, 1015, 1135, and/or voltage sensor(s) 132, 1025, 1115. Process 1100 may determine electrical parameters relating to, for example, voltage input (s), voltage output(s), current input(s), current output(s), internal resistance(s), conductance(s), or any combination thereof. Process 1100 determines additional or alternative electrical parameters, for example, those discussed with respect to 1010, 1020, 1030, 1040, and 1060, as discussed with respect to FIG. 10.

At 1120, process 1100 determines acceleration. In some embodiments, process 1100 retrieves acceleration information from one or more accelerometers 1125 (e.g., accelerometer 131). In an example, process 1100 receives acceleration information relating to one or more directions. For example, accelerometer 1125 may be configured to detect acceleration in a single direction, e.g., vertical. In such an example, process 1100 may receive that information and determine magnitude of the vertical acceleration. In some embodiments, one or more accelerometers 1125 may be configured to measure acceleration in more than one direction, e.g., by having multiple accelerometers configured to detect acceleration in one direction or by having a single accelerometer that is configured to detect acceleration in multiple directions. In some embodiments, process 1100 may proceed directly to 1150 once it has determined acceleration.

Although techniques of determining acceleration may be illustrated and discussed with respect to determining the acceleration experienced by a battery cell, such techniques may be applied to determining various parameters for one or more of the energy units of the battery cell. For example, process 1100 may determine the acceleration experienced by one or more energy units of the battery cell. One or more of the parameters considered or determined at 1120 may be stored, for example, at memory 112, 1045, 1145.

At 1140, process 1100 determines remaining useable life of the battery cell. In some embodiments, process 1100 considers voltage, and/or current parameters (e.g., those discussed with respect to 1110), acceleration, and/or internal resistance, or any combination thereof.

In some embodiments, process 1100 determines a single alphanumerical value indicative of the remaining useable life of the battery cell (e.g., A-F, 1-10, 1-100, etc.). In such embodiments, process 1100 may weight one or more of the various parameters such that it has a higher or lower impact on the remaining useable life value. For example, process 1100 may weight acceleration higher than other parameters discussed. Additionally, process 1100 may weight acceleration in a particular direction higher than other directions. In such an example, process 1100 may weight vertical acceleration higher than acceleration in other directions. In other examples, process 1100 may weight certain parameters higher or lower based on other parameters, for example, time. Although weighting a single parameter higher or lower may be discussed, process 1100 may weight any number of parameters to any degree, without departing from the contemplated embodiments. In one illustrative example, a new battery cell may have a remaining useable life of 100 and one or more acceleration thresholds may be used in connection with determining the remaining useable life. For example, if the new battery cell were dropped on a hard surface and experienced high acceleration (e.g., 5,000 gs) that exceeds a first threshold, the remaining useable life may be reduced by 5 to 95. However, if the battery cell were to experience an acceleration greater than a second higher threshold, the remaining useable life may be reduced by 10 to 90. High acceleration may reduce the remaining useable life by a fixed amount or by a percentage amount.

Memory illustrated and described with respect to 1145 may be any type of storage device. For example, one or more of the parameters and/or information discussed herein may be stored locally (e.g., at a memory or storage device located at the battery cell) or remotely (e.g., at a memory or storage device not located at the battery cell). Moreover, memory may be embodied by any device capable of storing information, including a hard drive, a flash drive, magnetic storage, optical storage, etc., or any combination thereof. Additionally, information retrieved from sensors or other data sources that are not located at the battery cell may be stored on memory at 1145. For example, a storage device local to a battery cell may store information obtained from sensors located at other battery cells. In such an array configuration, a single storage device at a particular battery cell may store information related to other battery cells.

At 1150, process 1100 determines whether threshold(s) is/are met. In various embodiments, process 1100 may consider thresholds for one or more parameters. For example, process 1100 may consider one or more thresholds related to acceleration, voltage, current, temperature, charge-discharge cycles, internal resistance, or any combination thereof.

In an example embodiment, process 1150 determines whether an acceleration threshold is met. In such an embodiment, process 1100 may consider the acceleration information determined at, for example, 1120, to determine whether the battery cell experiences an acceleration (sometimes referred to as shock loading) that exceeds a threshold. For example, process 1100 may consider whether the battery cell experiences an acceleration that exceeds 100 gs. In such an example, process 1100 compares the information determined at 1120 to determine whether that acceleration is greater than 100 gs. In the event that process 1100 determines that the acceleration exceeds 60 gs process 1100 may proceed to step 1155. Although a particular acceleration value may be illustrated and described as being a maximum, any shock loading value may be implemented as a maximum without departing from the contemplated embodiments. Additionally, the applicable maximum may be static or dynamic. In a dynamic embodiment, the applicable value may vary depending on, for example, the type of battery, the remaining useful life of the battery, the state of charge of the battery, the temperature of the battery, the capacity of the battery, the age of the battery, historical information relevant to the battery, or any other applicable factor, or any combination thereof. In the event that process 1100 determines that the battery cell did not experience an acceleration that exceeds 100 gs, process 1100 may proceed to step 1160. In some embodiments, process 1100 proceeds from 1150 to 1165.

Although certain thresholds may be illustrated and described herein as relating to acceleration, any threshold value relating to any parameter relevant to process 1100 or a battery cell may be considered without departing from the contemplated embodiments. For example, process 1100 may consider maximum and minimum thresholds for relating to temperature information, internal resistance, conductance, remaining useable life, charge-discharge cycles, throughput watt hours, or any combination thereof. Additionally, relevant thresholds considered by process 1100 are not limited to absolute values. For example, process 1100 may consider a percentage as a minimum or maximum threshold.

Moreover, maximum or minimum threshold values may be dependent on other values. For example, process 1100 may consider a combination of temperature and acceleration when assessing whether a threshold is met. In another example, process 1100 may adjust thresholds based on other information. For example, an acceleration threshold for a battery cell at a higher temperature may be different than an acceleration threshold for the same battery cell at a lower temperature. In another example, process 1100 may have different acceleration thresholds for different directions. In such an example, the threshold value for lateral acceleration may be higher or lower than the threshold value for vertical acceleration. Alternatively, process 1100 may vary the acceleration thresholds based on the orientation of the battery cell, the orientation of the energy units within a battery cell, or a combination thereof.

In some embodiments, the threshold values for one or more parameters may be static or dynamic. In another example, process 1100 may adjust (e.g., raise or lower) threshold values based on, for example, a number of charge-discharge cycles or age of the battery cell. In such an example, process 1100 may lower a maximum threshold value for acceleration for a battery cell that has experienced a high number of charge-discharge cycles. Conversely, process 1100 may raise an acceleration maximum threshold for a battery cell that has experienced little to no charge discharge cycles (i.e., the battery is new).

Any information associated with 1150 may optionally be stored, for example, at memory 1145. Continuing with the previous example, process 1100 may store the raw accelerometer information retrieved from 1125, the information considered and the results of 1110 and 1120, information relating to the remaining usable life, as determined at 1140, the acceleration threshold considered, whether the threshold was met, any notifications or other information sent or used at 1155, or any combination thereof.

At 1160, process 1100 optionally displays information. In some embodiments, process 1100 sends a notification pertaining to one or more parameters discussed herein, for example, via communicator 1155. The same notification may be displayed at 1160. In some embodiments, the information is displayed at a display associated with a battery cell. In such embodiments, a display may be associated with battery cell that is capable of displaying a graphical user interface, for example, a display panel. In other embodiments, the display may be embodied by a digital read out or by illuminating buttons or lights. For example, the battery cell may have an indicator light that indicates, when illuminated, that process 1100 has determined that the battery cell has experienced an acceleration that exceeds one or more thresholds.

At the conclusion of 1160, process 1100 proceeds to step 1165 where it exits the process. In some embodiments, process 1100 does not execute 1160 and, in such embodiments, proceeds from 1150 to 1165. In some embodiments, at the conclusion of 1165, process 1100 may return to one or more points, for example, to 1105 where the process cycle starts.

One or more of the steps discussed with respect to FIG. 11 may be implemented at various control circuitry devices, for example, control circuitry 114. Additionally, such steps may be undertaken by one or more devices, for example, battery odometer 110, 210, 310, 510, 610, 710, 810, 910, 1010, 1110. The steps may be undertaken when monitoring a battery cell, for example, battery cell 105, 305, 320, 405, 420, 505, 605, 705, 805, 820, 905; and/or when monitoring individual energy units, for example, energy unit 120, 520, 620, 920, 1020, 1120.

Figure 12:
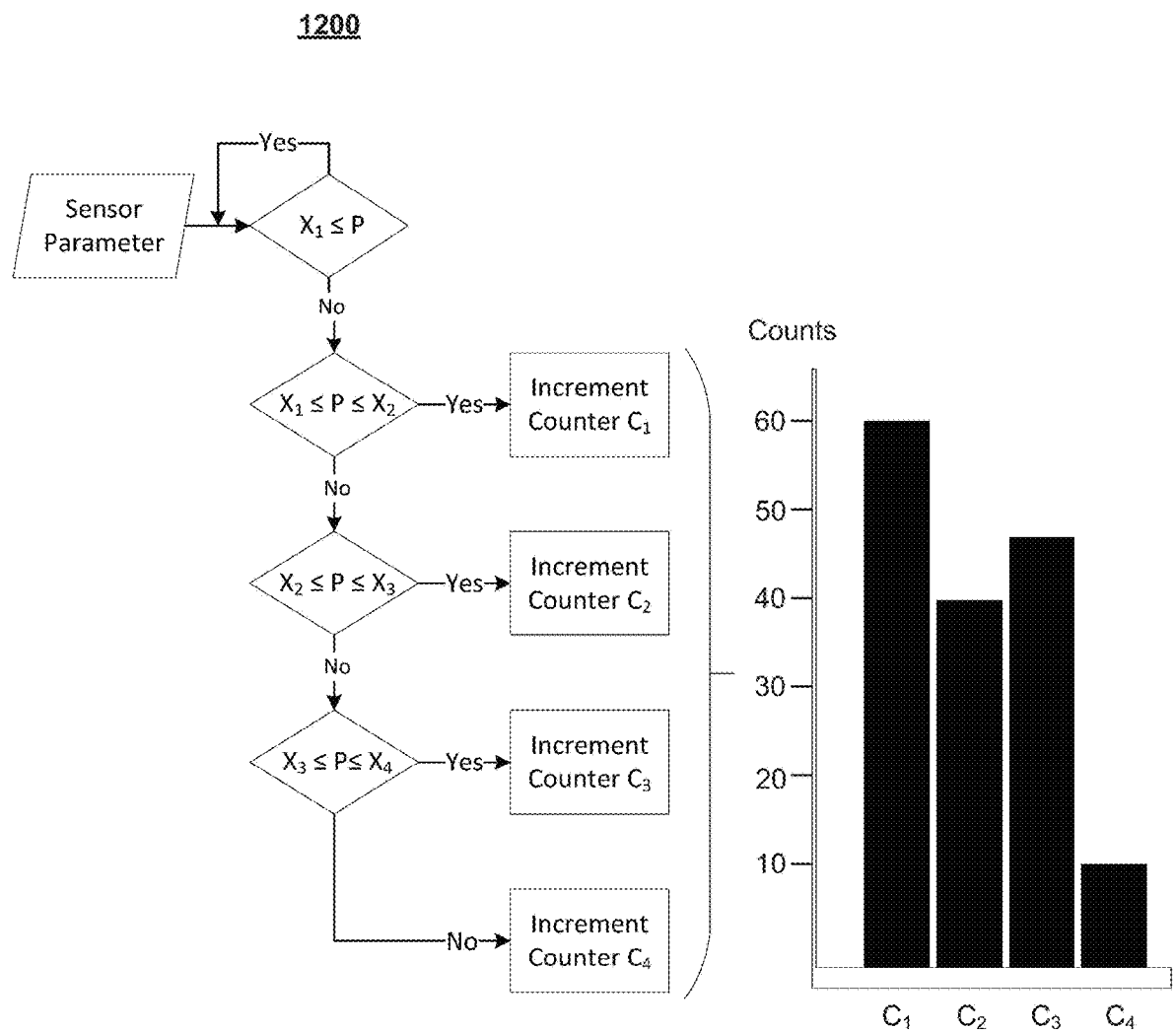
FIG. 12 depicts an illustrative process of an example energy monitoring system, in accordance with embodiments of the disclosure.

FIG. 12 illustrates an example technique for counting a number of occurrences, according to various embodiments of the present disclosure. As illustrated, process 1200 determines the number of occurrences that a parameter or condition is met and maintains a running count of those occurrences. In an embodiment, process 1200 may count the number of occurrences that a battery cell has experiences an acceleration (e.g., a shock loading) that exceeds particular thresholds. In such an example, process 1200 may be configured to determine the number of occurrences that a detected acceleration (P) occurs between the values of $X_1=5$ gs; $X_2=40$ gs; $X_3=60$ gs; and $X_4=100$ gs. In such an example, process 1200 receives sensor information and iteratively compares it to the threshold values and increments the counters accordingly.

To illustrate by example, the sensor parameter received indicates that the battery cell experienced an acceleration of 50 units of gravity (gs). In such an example, process 1200 first compares the acceleration to $X_1$ (5 gs). Since 50 is greater than 5, process 1200 proceeds to the next comparison. Process 1200 then compares 50 gs to $X_2$ (40 gs). Since 50 is greater than 40, process 1200 proceeds to the next comparison. Process 1200 then compares 50 gs to $X_3$ (60 gs). Since 50 is less than or equal to 60 gs and is greater than or equal to 40 gs, process 1200 increments the $C_3$ counter by one increment.

To illustrate by another example, the sensor parameter received indicates that the battery cell experienced an acceleration of 3 gs. In such an example, process 1200 first compares the acceleration to $X_1$ (5 gs). Since 3 is less than or equal 5, process 1200 returns and does not increment any counter.

Although process 1200 may be illustrated and described as counting the number of occurrences that acceleration exceeds certain thresholds, any type of sensor information or any other parameter relevant to the various embodiments of the present disclosure may be counted and maintained without departing from the contemplated embodiments. For example, the techniques described with respect to FIG. 12 my additionally or alternatively be applied to voltage parameters, current parameters, temperature parameters, internal resistance parameters, conductance parameters, temperature parameters, charge-discharge cycle parameters, throughput watt hours parameters, or any combination thereof.

One or more of the steps discussed with respect to FIG. 12 may be implemented at various control circuitry devices, for example, control circuitry 114. Additionally, such steps may be undertaken by one or more devices, for example, battery odometer 110, 210, 310, 510, 610, 710, 810, 910, 1010, 1110. The steps may be undertaken when monitoring a battery cell, for example, battery cell 105, 305, 320, 405, 420, 505, 605, 705, 805, 820, 905; and/or when monitoring individual energy units, for example, energy unit 120, 520, 620, 920, 1020, 1120.

Figure 13:
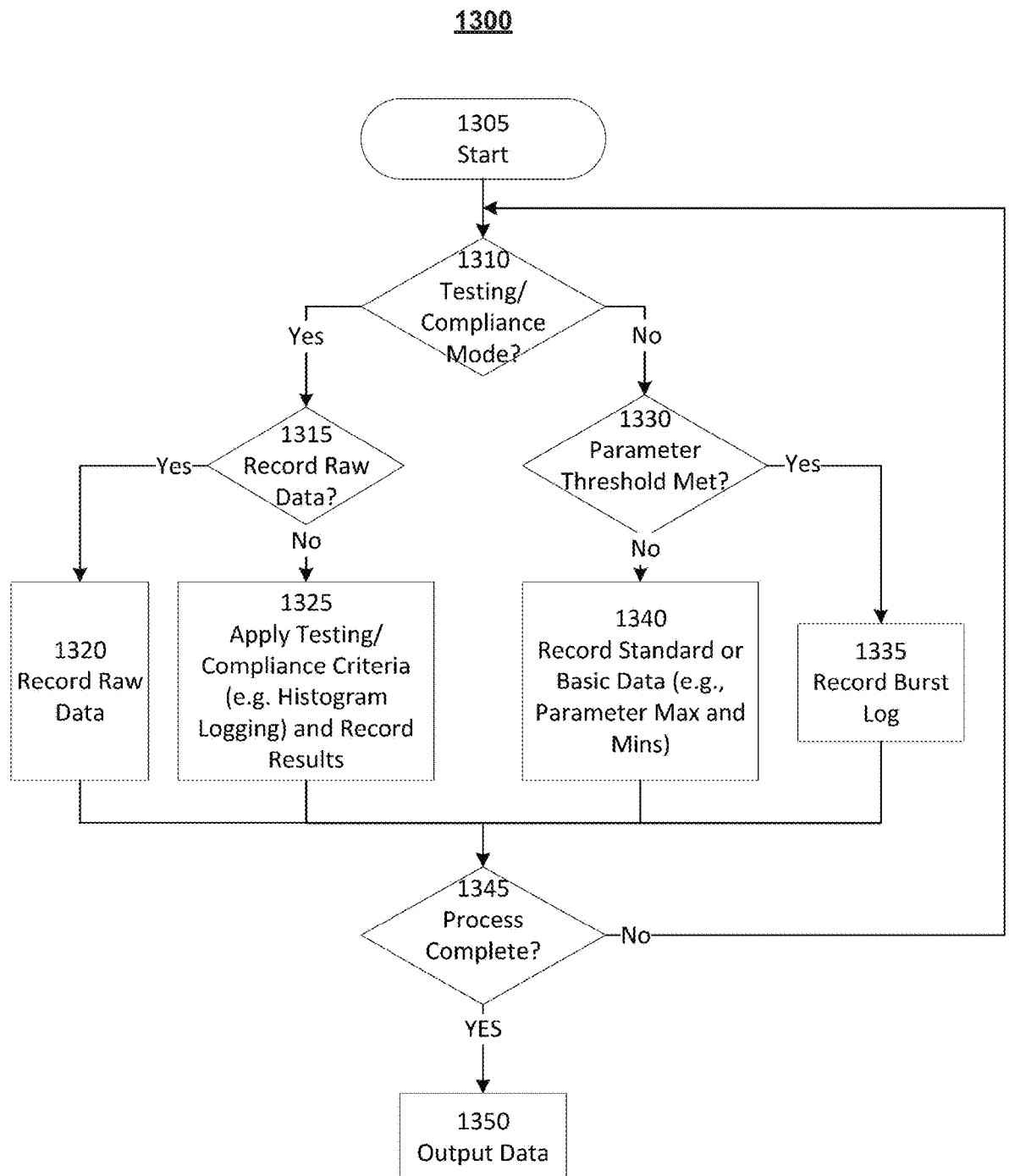
FIG. 13 depicts an illustrative process of an example energy monitoring system, in accordance with embodiments of the disclosure.

FIG. 13 illustrates an example process for testing and recording data, according to various embodiments of the present disclosure. The techniques illustrated and described with respect to FIG. 13 may be undertaken in accordance with other embodiments of the present disclosure. For example, the techniques of process 1300 may be undertaken at 1010, 1020, 1030, 1040, 1050, or any combination thereof, as discussed with respect to FIG. 10. The techniques of process 1300 may also be undertaken at 1110, 1120, 1140, 1160, or any combination thereof, as discussed with respect to FIG. 11.

At 1305, process 1300 starts. In some embodiments, process 1300 may start based on user input, for example, a user selecting a testing and recording operational state. In other embodiments, process 1300 starts in response to a catalyzing event, for example, a load being applied to the battery cell, a unit of time has elapsed, a number of charge-discharge cycles has occurred, a number of throughput watt hours has occurred, or any other occurrence relevant to the techniques discussed herein.

At 1310, process 1300 determines whether a testing or compliance mode has been selected. In some embodiments, selecting a testing/compliance mode may be achieved through user input. For example, a user may select that process 1300 enter into the testing/compliance mode using a user interface. In other embodiments, testing/compliance mode may be selected periodically, for example, once per year (or any other relevant unit of time). In other embodiments, testing/compliance mode may be selected based on a catalyzing event. In the event that process 1300 determines that the testing/compliance mode has been selected, process 1300 proceeds to 1315. In the event that process 1300 determines that testing/compliance mode has not been selected, process 1300 proceeds to 1330.

At 1315, process 1300 determines whether raw data is to be recorded. In some embodiments process 1300 determines whether raw data should be recorded based on user input. In other embodiments, process 1300 determines whether raw data should be recorded based on a profile associated with the battery cell. In such an embodiment, the profile may indicate that raw data is to be recorded under certain conditions, for example, a periodic testing and recording cycle. In the event that process 1300 determines that raw data is not to be recorded, process 1300 proceeds to 1325. In the event that process 1300 determines that raw data is to be recorded, process 1300 proceeds to 1320.

At 1320, process 1300 records raw data. To illustrate by way of example, process 1300 may be undertaken when the energy system determines whether a voltage minimum threshold has been met (for example, at 1020 as discussed with respect to FIGS. 10 and/or 1110 as discussed with respect to FIG. 11). In such an example, process 1300 may record the raw data received from a voltage sensor (for example, voltage sensor 1025 as discussed with respect to FIG. 10 and/or voltage sensor 1115 as discussed with respect to FIG. 11). The raw data may be recorded at any storage device, whether local or remote to the battery cell. For example, raw data may be recorded at memory 1045 as discussed with respect to FIG. 10 and/or memory 1145, as discussed with respect to FIG. 11.

At 1325, process 1300 applies testing/compliance criteria and records results. In an embodiment, process 1300 implements histogram logging whereby process 1300 determines whether certain parameters meet or exceed certain thresholds and increments a counter based on the number of occurrences. Such a technique is illustrated and described in process 1200, as discussed with respect to FIG. 12. In this way, process 1300 stores relevant information efficiently without needing to store raw data. In some embodiments however, process 1300 may undertake 1320 and 1325 whereby histogram logging is implemented while process 1300 stores raw data.

Returning to 1330, process 1300 determines whether a parameter threshold is met. Continuing with the previous example, process 1300 determines whether a voltage minimum threshold of 2.49 volts has been met (for example, at 1020 and/or 1060 as discussed with respect to FIGS. 10 and/or 1110 and/or 1150 as discussed with respect to FIG. 11). In such an example, process 1300 compares information received from a voltage sensor (for example, voltage sensor 1025 as discussed with respect to FIG. 10 and/or voltage sensor 1115 as discussed with respect to FIG. 11) to a minimum threshold value of 2.50 volts. In the event that process 1300 determines that the threshold is met, process 1300 continues to 1335. In the event that process 1300 determines that the threshold is not met, process 1300 proceeds to 1340.

At 1335, process 1300 records a burst log. Continuing with the previous example, in the event that process 1300 determines that the output voltage of a battery cell is below the minimum threshold process 1300 stores such burst log information in a memory (for example, memory 112 as discussed with respect to FIG. 1, memory 1045 as discussed with respect to FIG. 10, and/or memory 1145, as discussed with respect to FIG. 11). Burst log information may include raw sensor data and/or high-resolution parameter data before and after the threshold event. For example, if the measured temperature exceeds a threshold, the raw temperature values may be recorded for an amount of time (e.g., 5 minutes) before the threshold event and for an amount of time (e.g., 15 minutes) after the threshold event. In some embodiments, the raw sensor data may be recorded for other parameters as well (e.g., current, voltage, acceleration, etc.).

At 1340, process 1300 records standard or basic data. For example, process 1300 may record the parameter that was considered along with maximum and/or minimum values/ thresholds that pertain to that parameter. Continuing with the earlier example, process 1300 may record the voltage minimum threshold value of 2.50 volts. In some embodiments, process 1300 optionally record the determined voltage that was compared to the minimum threshold value. In other embodiments, process 1300 may optionally record ancillary data associated with the determination, for example, date/ time information indicating of when the determination was undertaken.

At 1345, process 1300 determines whether the process is complete. Process 1300 may determine whether the process is complete based on an any parameter relevant to the techniques discussed herein. For example, process 1300 may be determine whether the process is complete based on a profile associated with a battery cell. In another example process 1300 may be determine that the process is complete based on user input. In the event that process 1300 determines that process 1300 is not complete, process 1300 returns to 1310. In the event that process 1300 determines that the process is complete, process 1300 proceeds to 1350.

At 1350, process 1300 outputs data. In some embodiments, process 1300 outputs the data to be displayed at a display (for example, 1160, as discussed with respect to FIG. 11). In some embodiments, process 1300 outputs data to other systems or processes for further consideration or use. For example, process 1300 may output the data to a notification system that sends a notification using a communicator (for example communicator 1055, as discussed with respect to FIG. 10 and/or communicator at 1155 as discussed with respect to FIG. 11).

One or more of the steps discussed with respect to FIG. 13 may be implemented at various control circuitry devices, for example, control circuitry 114. Additionally, such steps may be undertaken by one or more devices, for example, battery odometer 110, 210, 310, 510, 610, 710, 810, 910, 1010, 1110. The steps may be undertaken when monitoring a battery cell, for example, battery cell 105, 305, 320, 405, 420, 505, 605, 705, 805, 820, 905; and/or when monitoring individual energy units, for example, energy unit 120, 520, 620, 920, 1020, 1120.

The processes discussed herein are intended to be illustrative and not limiting. For instance, the steps of the processes discussed herein may be omitted, modified, combined, and/or rearranged, and any additional steps may be performed without departing from the scope of the invention. More generally, the above disclosure is meant to be illustrative and not limiting. Only the claims that follow are meant to set bounds as to what the present invention includes. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time. It should also be noted that the systems and/or methods described above may be applied to, or used in accordance with, other systems and/or methods.

What is claimed is:

1. A method comprising:
    monitoring, from an accelerometer integrated in a battery cell, acceleration information over time;
    monitoring electrical information for at least one electrical parameter of the battery cell over time; and
    storing, at a memory integrated in the battery cell, the acceleration information and the electrical information for determining remaining useable life of the battery cell.

2. The method of claim 1 further comprising:
    determining, based on the acceleration information, a maximum acceleration, wherein storing the acceleration information comprises storing the maximum acceleration.

3. The method of claim 1, wherein:
    the at least one electrical parameter comprises one or more of a voltage output of the battery cell or a current output of the battery cell.

4. The method of claim 1 further comprising:
    determining, based on the monitored electrical information, a number of charge-discharge cycles of the battery cell.

5. The method of claim 4 further comprising:
    determining, based on the electrical information and the number of charge-discharge cycles of the battery cell, a discharge depth for each charge-discharge cycle of the battery cell.

6. The method of claim 1 further comprising:
    determining, using control circuitry, a maximum or minimum value of the acceleration information and the at least one electrical parameter, wherein storing the acceleration information and the electrical information comprises storing the maximum or minimum values.

7. The method of claim 1 further comprising:
    determining, using control circuitry, the state of health of the battery cell indicative of the battery cell's projected performance based on the acceleration information and the electrical information.

8. A system comprising:
    an accelerometer integrated in a battery cell;
    control circuitry configured to:
        receive acceleration information from the accelerometer;
        monitor the acceleration information over time; and
        monitor electrical information for at least one electrical parameter of the battery cell over time; and
    memory integrated into the battery cell configured to:
        store the acceleration information and the electrical information for determining remaining useable life of the battery cell.

9. The system of claim 8, wherein:
    the control circuitry is further configured to determine, based on the acceleration information, a maximum acceleration; and
    the memory is further configured to store the maximum acceleration.

10. The system of claim 8, wherein:
    the control circuitry is further configured to receive, from a temperature sensor, temperature information; and
    the memory is further configured to store the temperature information.

11. The system of claim 8 further comprising:
    a display communicatively coupled to the control circuitry and configured to display the stored acceleration information and the electrical information.

12. The system of claim 11 further comprising:
    a button communicatively coupled to the control circuitry and the display, the button configured to:
        receive a user input; and
        based on receiving the user input, cause the stored acceleration information and the electrical information to be displayed on the display.

13. The system of claim 8 further comprising:
an electrical port communicatively coupled to the control circuitry and configured to transmit the acceleration information and the electrical information to an external device.

14. The system of claim 8 further comprising:
a near-field communication (NFC) transceiver communicatively coupled to the control circuitry and configured to wirelessly transmit the acceleration information and the electrical information to an external device.

15. The system of claim 8, wherein:
the at least one electrical parameter comprises one or more of a voltage output of the battery cell or a current output of the battery cell.

16. The system of claim 8, wherein the control circuitry is further configured to:
determine, based on the monitored electrical information, a number of charge-discharge cycles of the battery cell.

17. The system of claim 16, wherein the control circuitry is further configured to:
determine, based on the electrical information and the number of charge-discharge cycles of the battery cell, a discharge depth for each charge-discharge cycle of the battery cell.

18. The system of claim 8, wherein:
the control circuitry is further configured to determine a maximum or minimum value of the acceleration information and the at least one electrical parameter; and
the memory is further configured to store the maximum or minimum values for the acceleration information and the electrical information.

19. The system of claim 8, wherein the control circuitry is further configured to:
determine, using control circuitry, the remaining useable life of the battery cell indicative of the battery cell's projected performance based on the acceleration information and the electrical information.

20. The system of claim 8, wherein:
the battery cell comprises a casing; and
the accelerometer, control circuitry, and the memory are located within the casing.

* * * * *